United States Patent
Lee et al.

(10) Patent No.: US 11,296,238 B2
(45) Date of Patent: Apr. 5, 2022

(54) THIN-FILM TRANSISTOR SUBSTRATE AND DISPLAY APPARATUS COMPRISING THE SAME

(71) Applicant: Samsung Display Co., Ltd., Yongin-si (KR)

(72) Inventors: Hyunjung Lee, Yongin-si (KR); Youngkuk Kim, Yongin-si (KR); Miseon Seo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/984,789

(22) Filed: Aug. 4, 2020

(65) Prior Publication Data

US 2021/0202759 A1 Jul. 1, 2021

(30) Foreign Application Priority Data

Dec. 30, 2019 (KR) .......................... 10-2019-0178502

(51) Int. Cl.
*H01L 29/786* (2006.01)
*H01L 27/32* (2006.01)

(52) U.S. Cl.
CPC .... *H01L 29/78696* (2013.01); *H01L 27/3244* (2013.01)

(58) Field of Classification Search
CPC .................. H01L 29/78696; H01L 27/3244
USPC ......................................................... 257/288
See application file for complete search history.

(56) References Cited

U.S. PATENT DOCUMENTS

| | | | |
|---|---|---|---|
| 8,530,273 | B2 | 9/2013 | Den Boer |
| 9,991,287 | B2 | 6/2018 | Lim et al. |
| 2007/0290227 | A1* | 12/2007 | Liang ................ H01L 29/78648 257/151 |
| 2018/0069069 | A1 | 3/2018 | Ebisuno et al. |
| 2018/0097053 | A1* | 4/2018 | Park .................... H01L 27/3248 |
| 2019/0214504 | A1 | 7/2019 | Song et al. |

FOREIGN PATENT DOCUMENTS

| | | |
|---|---|---|
| KR | 10-2015-0075512 | 7/2015 |
| KR | 10-2017-0078394 | 7/2017 |
| KR | 10-2017-0126535 | 11/2017 |

* cited by examiner

*Primary Examiner* — Tong-Ho Kim
(74) *Attorney, Agent, or Firm* — Kile Park Reed & Houtteman PLLC

(57) ABSTRACT

A thin-film transistor substrate and a display apparatus including the same includes a first thin-film transistor on a substrate. The first thin-film transistor includes a first semiconductor layer having a first channel area, a first source area, and a first drain area; a first lower gate electrode between the substrate and the first semiconductor layer; a first upper gate electrode on the first semiconductor layer and overlapping the first channel area; and a first electrode layer on the first upper gate electrode and electrically connected to at least one of the first source area and the first drain area. The first lower gate electrode overlaps the first channel area and the first drain area.

25 Claims, 17 Drawing Sheets

THIN-FILM TRANSISTOR SUBSTRATE AND DISPLAY APPARATUS COMPRISING THE SAME

CROSS-REFERENCE TO RELATED APPLICATIONS

This application claims priority to and benefits of Korean Patent Application No. 10-2019-0178502 under 35 U.S.C. § 119, filed on Dec. 30, 2019, in the Korean Intellectual Property Office, the entire contents of which are incorporated herein by reference.

BACKGROUND

1. Technical Field

One or more embodiments relate to a thin-film transistor substrate and a display apparatus comprising the same, and, to a thin-film transistor substrate having improved resolution and a display apparatus comprising the same.

2. Description of the Related Art

In general, a display apparatus may include a display element and a driving circuit that may control an electrical signal applied to the display element. The driving circuit may include a thin-film transistor (TFT), a storage capacitor, and wires.

The number of TFTs electrically connected to a display element has been increased in order to precisely control light emission of the display element and the amount of light emission. Accordingly, research has been actively conducted to solve the problems of high integration and power consumption of display apparatuses.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments may include a thin-film transistor substrate having improved resolution and a display apparatus including the same. However, this is merely an example, and the scope of the disclosure is not limited thereto.

Additional aspects will be set forth in part in the description which follows and, in part, will be apparent from the description, or may be learned by practice of the presented embodiments.

According to one or more embodiments, a thin-film transistor substrate may include a first thin-film transistor disposed on a substrate. The first thin-film transistor may include a first semiconductor layer comprising a first channel area, a first source area, and a first drain area, a first lower gate electrode disposed between the substrate and the first semiconductor layer, a first upper gate electrode disposed on the first semiconductor layer and overlapping the first channel area, and a first electrode layer disposed on the first upper gate electrode and electrically connected to at least one of the first source area and the first drain area, wherein the first lower gate electrode may overlap the first channel area and the first drain area.

In an embodiment, the first lower gate electrode may overlap the first semiconductor layer and may not overlap the first source area.

In an embodiment, the first upper gate electrode may include an end adjacent to the first source area, the first lower gate electrode may include an end adjacent to the first source area, and the end of the first upper gate electrode and the end of the first lower gate electrode may coincide with each other in a plan view.

In an embodiment, a distance between the first lower gate electrode and a conductive layer disposed on the substrate may be the same as a distance between the first upper gate electrode and the conductive layer on a plan view.

In an embodiment, the conductive layer may be a scan line.

In an embodiment, the first semiconductor layer may include a silicon semiconductor material or an oxide semiconductor material.

In an embodiment, the thin-film transistor substrate may further include a second thin-film transistor disposed on the substrate. The second thin-film transistor may include a second semiconductor layer, a second gate electrode partially overlapping the second semiconductor layer, and a second electrode layer disposed on the second gate electrode and electrically connected to the second semiconductor layer, wherein the first semiconductor layer may include an oxide semiconductor material, and the second semiconductor layer may include a silicon semiconductor material.

In an embodiment, the thin-film transistor substrate may further include a third thin-film transistor disposed on the substrate. The third thin-film transistor may include a third semiconductor layer comprising a third channel area, a third source area, and a third drain area, a third lower gate electrode disposed between the substrate and the third semiconductor layer, a third upper gate electrode disposed on the third semiconductor layer and overlapping the third channel area, and a third electrode layer disposed on the third upper gate electrode and electrically connected to at least one of the third source area and the third drain area, wherein the third lower gate electrode may overlap the third channel area and the third drain area, and the third semiconductor layer may comprise an oxide semiconductor material.

In an embodiment, the first semiconductor layer and the third semiconductor layer may be integral with each other and may have an isolated shape.

In an embodiment, the third lower gate electrode may overlap the third semiconductor layer and may not overlap the third source area.

In an embodiment, the third upper gate electrode may include an end adjacent to the third source area, the third lower gate electrode may include an end adjacent to the third source area, and the end of the third upper gate electrode and the end of the third lower gate electrode may coincide with each other in a plan view.

In an embodiment, the first thin-film transistor may be a compensation thin-film transistor, and the third thin-film transistor may be an initialization thin-film transistor.

In an embodiment, the thin-film transistor substrate may include a boost capacitor including a lower electrode and an upper electrode, wherein the lower electrode and the second gate electrode may be disposed on the same layer, and the upper electrode and the first semiconductor layer may be disposed on a same layer.

In an embodiment, the upper electrode may extend from the first semiconductor layer.

According to one or more embodiments, a display apparatus may include a first thin-film transistor disposed on a substrate and a display element electrically connected to the first thin-film transistor. The first thin-film transistor may include a first semiconductor layer comprising a first channel area, a first source area, and a first drain area, a first lower gate electrode disposed between the substrate and the first semiconductor layer, a first upper gate electrode disposed on the first semiconductor layer and overlapping the first channel area, and a first electrode layer disposed on the first upper gate electrode and electrically connected to at least one of the first source area and the first drain area, and the first lower gate electrode may overlap the first channel area and the first drain area.

In an embodiment, the first lower gate electrode may overlap the first semiconductor layer and may not overlap the first source area.

In an embodiment, the first upper gate electrode may include an end adjacent to the first source area, the first lower gate electrode may include an end adjacent to the first source area, and the end of the first upper gate electrode and the end of the first lower gate electrode may coincide with each other in a plan view.

In an embodiment, the first semiconductor layer may include a silicon semiconductor material or an oxide semiconductor material.

In an embodiment, the display apparatus may further include a second thin-film transistor disposed on the substrate. The second thin-film transistor may include a second semiconductor layer, a second gate electrode partially overlapping the second semiconductor layer, and a second electrode layer disposed on the second gate electrode and electrically connected to the second semiconductor layer, wherein the first semiconductor layer may include an oxide semiconductor material, and the second semiconductor layer may include a silicon semiconductor material.

In an embodiment, the display apparatus may further include a third thin-film transistor disposed on the substrate. The third thin-film transistor may include a third semiconductor layer comprising a third channel area, a third source area, and a third drain area, a third lower gate electrode disposed between the substrate and the third semiconductor layer, a third upper gate electrode on the third semiconductor layer and overlapping the third channel area, and a third electrode layer disposed on the third upper gate electrode and electrically connected to at least one of the third source area and the third drain area, wherein the third lower gate electrode may overlap the third channel area and the third drain area, and the third semiconductor layer may include an oxide semiconductor material.

In an embodiment, the third lower gate electrode may overlap the third semiconductor layer and may not overlap the third source area.

In an embodiment, the third upper gate electrode may include an end adjacent to the third source area, the third lower gate electrode may include an end adjacent to the third source area, and the end of the third upper gate electrode and the end of the third lower gate electrode may coincide with each other in a plan view.

In an embodiment, the first semiconductor layer and the third semiconductor layer may be integral with each other and may have an isolated shape.

In an embodiment, the display apparatus may further include a boost capacitor including a lower electrode and an upper electrode, wherein the lower electrode and the second gate electrode may be disposed on a same layer, and the upper electrode and the first semiconductor layer may be disposed on a same layer.

In an embodiment, the display apparatus may include a storage capacitor including the second gate electrode as a first electrode, and a second electrode disposed on the second gate electrode, wherein the first lower gate electrode and the second gate electrode may be disposed on a same layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

Figure 1:
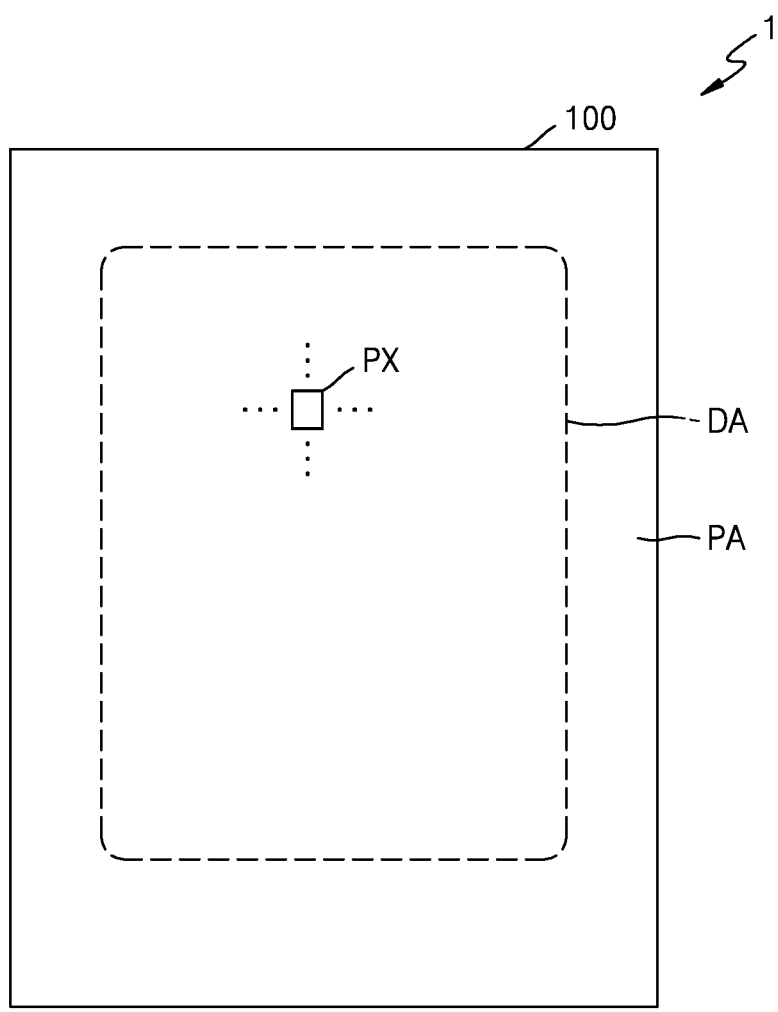
FIG. 1 is a plan view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Since the disclosure may have diverse modified embodiments, various embodiments are illustrated in the drawings and are described in the detailed description. Advantages and features of the embodiments, and implementation methods thereof will be clarified through following embodiments described with reference to the accompanying drawings. The disclosure may, however, be embodied in many different forms and should not be construed as limited to the embodiments set forth herein.

Reference will now be made in detail to embodiments, examples of which are illustrated in the accompanying drawings, wherein like reference numerals refer to like elements throughout, and repeated description thereof will be omitted.

It will be understood that although the terms "first," "second," etc. may be used herein to describe various components, these components should not be limited by these terms. These terms are only used to distinguish one element from another. For instance, a first element discussed below could be termed a second element without departing from the teachings of the disclosure. Similarly, the second element could also be termed the first element.

An expression used in the singular encompasses the expression of the plural, unless it has a clearly different meaning in the context. It will be further understood that when the terms "comprises," "comprising," "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When an embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when a layer, region, or element is referred to as being "connected to" or "coupled to" another layer, region, or element, it can be directly connected or coupled to the other layer, region, or element or intervening layers, regions, or elements may be present. For example, as used herein, when a layer, region, or element is referred to as being "electrically connected to" another layer, region, or element, it can be directly electrically connected to the other layer, region, or element or intervening layers, intervening regions, or intervening elements may be present.

Also, when an element is referred to as being "in contact" or "contacted" or the like to another element, the element may be in "electrical contact" or in "physical contact" with another element; or in "indirect contact" or in "direct contact" with another element.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

An x-axis, a y-axis and a z-axis are not limited to three axes of the rectangular coordinate system and may be interpreted in a broader sense. For example, the x-axis, the y-axis, and the z-axis may be perpendicular to one another, or may represent different directions that may not be perpendicular to one another.

Hereinafter, the disclosure will be described in detail with reference to the accompanying drawings.

Figure 2:
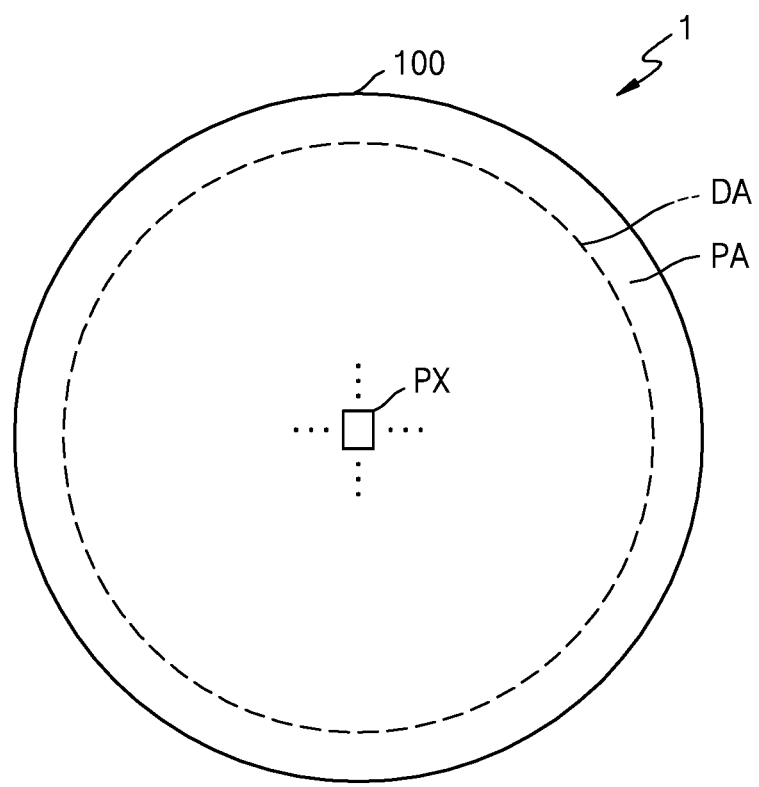
FIG. 2 is a plan view of a display apparatus according to an embodiment.

FIGS. 1 and 2 are schematic plan views of a display apparatus 1 according to an embodiment.

Referring to FIGS. 1 and 2, the display apparatus 1 includes may include a display area DA that may implement or display an image and a peripheral area PA around the display area DA. The display apparatus 1 may provide or display an image to the outside by using light emitted from the display area DA. It is to be understood that 'image' may include more than one image, and thus plural images.

A substrate 100 may be divided into the display area DA in which an image may be displayed and a peripheral area PA around the display area DA.

The substrate 100 may include various materials such as glass, metal, or plastic. According to an embodiment, the substrate 100 may include a flexible material. Here, the flexible material may refer to a substrate that may be bent, folded, or rolled well. The substrate 100 of the flexible material may include ultra-thin glass, metal, or plastic, or other flexible material within the spirit and the scope of the disclosure.

In the display area DA of the substrate 100, pixels PX including various display elements such as an organic light-emitting diode OLED may be arranged or disposed. The pixels PX may be plural, and the pixels PX may be arranged or disposed in various forms such as a stripe array, a pentile array, a mosaic array, and the like to implement an image.

When the display area DA is viewed in a planar shape, the display area DA may be provided in a substantially rectangular shape as shown in FIG. 1 or a substantially circular shape as shown in FIG. 2. In an embodiment, the display area DA may be provided in a substantially polygonal shape such as a triangle, a pentagon, and a hexagon, a substantially elliptical shape, an amorphous shape, or the like within the spirit and the scope of the disclosure.

The peripheral area PA of the substrate 100 may be an area around the display area DA and may be an area where no image may be displayed. In the peripheral area PA, various wires that may transmit an electrical signal to be applied to the display area DA and pads to which a printed circuit board or a driver IC chip may be attached may be located or disposed.

Hereinafter, a display apparatus including an organic light-emitting diode as a display element will be described for convenience. However, the embodiments may be applied to various types of display apparatuses such as liquid crystal display apparatuses, electrophoretic display apparatuses, inorganic EL display apparatuses, and the like within the spirit and the scope of the disclosure.

Figure 3:
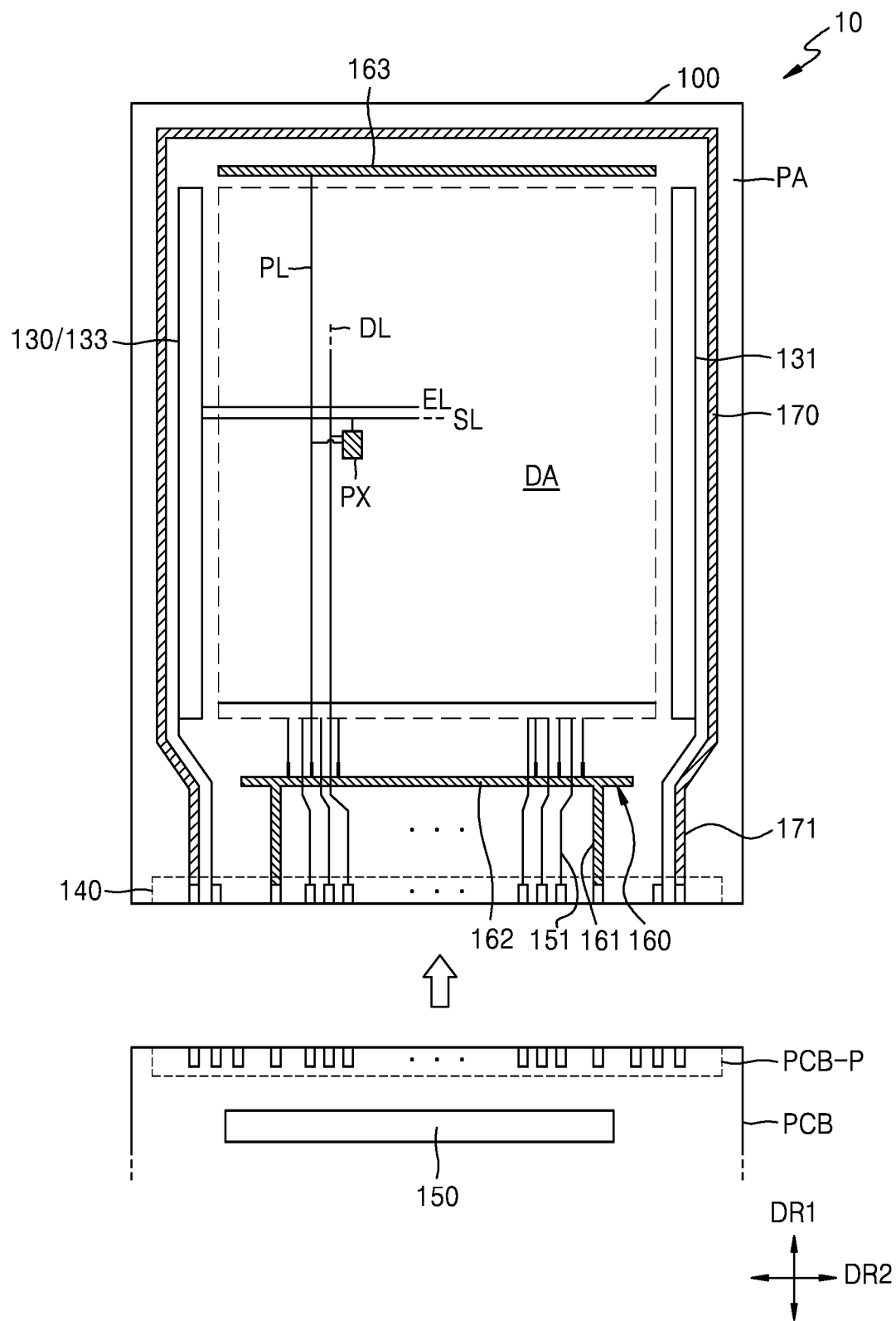
FIG. 3 is a plan view of a display panel according to an embodiment.

FIG. 3 is a plan view of a display panel 10 according to an embodiment.

Referring to FIG. 3, the display panel 10 may include the display area DA and the peripheral area PA, and pixels PX in the display area DA. Each of the pixels PX may include a display element such as the organic light-emitting diode OLED. Each pixel PX may emit light of, for example, red, green, blue, or white through the organic light-emitting diode OLED. Hereinafter, in the specification, each pixel PX may mean a sub-pixel that may emit a different color. Each pixel PX may be, for example, one of a red (R) sub-pixel, a green (G) sub-pixel, and a blue (B) sub-pixel. The display area DA may be covered or overlapped by an encapsulation member (not shown) to protect the display area DA from outside air or moisture.

Each pixel PX may be electrically connected to outer circuits arranged or disposed in the peripheral area PA. A first scan driving circuit 130, a second scan driving circuit 131, an emission control driving circuit 133, a terminal 140, a data driving circuit 150, a first power supply wire 160, and a second power supply wire 170 may be arranged or disposed in the peripheral area PA.

The emission control driving circuit 133 may provide an emission control signal to each pixel PX through an emission control line EL. The first scan driver circuit 130 may provide a scan signal to each pixel PX through a scan line SL. The second scan driver circuit 131 may be arranged or disposed in parallel with the first scan driver circuit 130 with the display area DA therebetween. Some of the pixels PX in the display area DA may be electrically connected to the first scan driver circuit 130, and other pixels PX may be electrically connected to the second scan driver circuit 131. In an embodiment, the second scan driving circuit 131 may be omitted.

The terminal 140 may be on a side of the substrate 100. The terminal 140 may be exposed without being covered or overlapped by the insulating layer and electrically connected to a printed circuit board PCB. A terminal PCB-P of the printed circuit board PCB may be electrically connected to the terminal 140 of the display panel 10. The printed circuit board PCB may transmit a signal or power of a controller (not shown) to the display panel 10.

Control signals generated by the controller may be transmitted to the first and second scan driving circuits 130 and 131 through the printed circuit board PCB, respectively. The controller may provide first and second power supply voltages ELVDD and ELVSS (see FIG. 5 to be described later below) to the first and second power supply wires 160 and 170 through first and second connecting wires 161 and 171, respectively. The first power supply voltage ELVDD may be provided to each pixel P through a driving voltage line PL electrically connected to the first power supply wire 160, and the second power supply voltage ELVSS may be provided to an opposite electrode 330 (see FIG. 7 to be described later below) of each pixel P electrically connected to the second power supply wire 170.

The data driver circuit 150 may be electrically connected to a data line DL. A data signal of the data driver circuit 150 may be provided to each pixel PX through a connecting wire 151 electrically connected to the terminal 140 and the data line DL electrically connected to the connecting wire 151. FIG. 3 shows that the data driving circuit 150 may be disposed on the printed circuit board PCB. However, in an embodiment, the data driving circuit 150 may be disposed on the substrate 100. For example, the data driver circuit 150 may be disposed between the terminal 140 and the first power supply wire 160.

The first power supply wire 160 may include a first sub wire 162 and a second sub wire 163 extending in parallel in a second direction DR2 with the display area DA disposed therebetween. The second power supply wire 170 may partially surround the display area DA in a substantially loop shape with one side open.

Figure 4:
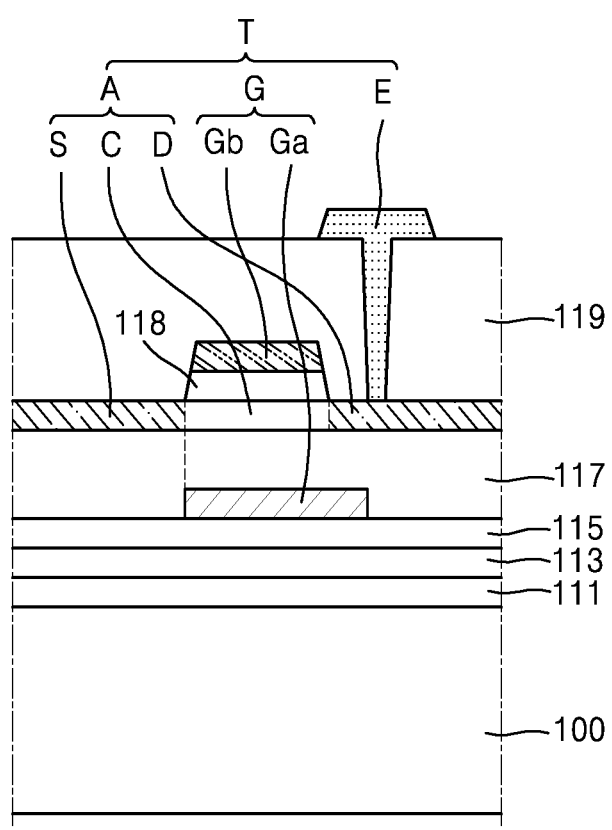
FIG. 4 is a schematic cross-sectional view of a portion of a thin-film transistor substrate included in a display apparatus according to an embodiment.

FIG. 4 is a schematic cross-sectional view of a portion of a thin-film transistor substrate included in a display apparatus according to an embodiment.

Referring to FIG. 4, a thin-film transistor substrate TB according to an embodiment may include a thin-film transistor T having a semiconductor layer A, a lower gate electrode Ga, an upper gate electrode Gb, and an electrode layer E, wherein the semiconductor layer A may have a channel area C, a source area S, and a drain area D, and the electrode layer E may be disposed on or above the upper gate electrode Gb and may be electrically connected to at least one of the source area S and the drain area D. The lower gate electrode Ga may overlap the semiconductor layer A, but may overlap the channel area C and the drain area D. It is to be understood that the term 'area' may also refer to a region.

As illustrated in FIG. 4, edges of the lower gate electrode Ga and the upper gate electrode Gb may be aligned in a thickness direction from the substrate 100 to a second interlayer insulating layer 119. In other words, the edges of the lower gate electrode Ga and the upper gate electrode Gb may coincide in a thickness direction from the substrate 100 to the second interlayer insulating layer 119. In this context, coincide may mean align.

The lower gate electrode Ga may be arranged or disposed to overlap at least a portion of the semiconductor layer A, and may overlap the semiconductor layer A by avoiding or being separate from the source area S. In other words, the lower gate electrode Ga may overlap the channel area C and the drain area D of the semiconductor layer A. The lower gate electrode Ga may include a portion at least partially overlapping the channel area C and a portion at least partially overlapping the drain area D. The lower gate electrode Ga may be disposed so as not to overlap the source area S.

Hereinafter, referring to FIG. 4, the configuration or structure included in the thin-film transistor substrate TB will be described in more detail according to a stacking order.

The substrate 100 may include a glass material, a ceramic material, a metal material, or a material having flexible or bendable characteristics. When the substrate 100 is flexible or bendable, the substrate 100 may include a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single layer or a multilayer structure of the material, and in the case of the multilayer structure, may include an inorganic layer. In an embodiment, the substrate 100 may have an organic/inorganic/organic structure.

A barrier layer 110 (see FIG. 7) may be included between the substrate 100 and a buffer layer 111. The barrier layer 110 may prevent or minimize the penetration of impurities from the substrate 100 into the semiconductor layer A. The barrier layer 110 may include an inorganic material, such as an oxide or nitride, an organic material, or an organic-inorganic composite material, and may have a single layer structure or a multilayer structure including an inorganic material and/or an organic material.

Although FIG. 4 illustrates that the semiconductor layer A may be disposed on a first interlayer insulating layer 117 to be described later below, the semiconductor layer A may be disposed on the buffer layer 111. The semiconductor layer A may include amorphous silicon or polysilicon. In an embodiment, the semiconductor layer A may include an oxide of at least one of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, the semiconductor layer A may be an InSnZnO (ITZO) semiconductor layer, an InGaZnO (IGZO) semiconductor layer, or the like within the spirit and the scope of the disclosure.

The thin-film transistor T may include the semiconductor layer A, a gate electrode G arranged or disposed to at least partially overlap the semiconductor layer A, and the electrode layer E electrically connected to the semiconductor layer A.

The semiconductor layer A may include the channel area C and the source area S and the drain area D on a side and another side of the channel area C, respectively. The semiconductor layer A may be a single layer or multiple layers. As shown in FIG. 4, gate electrodes G may be on upper and lower portions of the semiconductor layer A, respectively.

A first gate insulating layer 113 and a second gate insulating layer 115 may be disposed on the substrate 100, and a third gate insulating layer 118 may be stacked or disposed on the semiconductor layer A. The first gate insulating layer 113, the second gate insulating layer 115, and the third gate insulating layer 118 may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$). FIG. 4 illustrates the buffer layer 111, the first gate insulating layer 113, and the second gate insulating layer 115 between the substrate 100 and the lower gate electrode Ga, which may be omitted.

In an embodiment, as illustrated in FIG. 4, the third gate insulating layer 118 may be patterned to overlap a portion of the semiconductor layer A. An area where the third gate insulating layer 118 and the semiconductor layer A may overlap may be understood as the channel area C. The source area S and the drain area D may be subjected to a process such as conductorization or impurity doping by plasma treatment, wherein a portion of the semiconductor layer A overlapping the third gate insulating layer 118 may not be exposed by plasma treatment or impurity doping, and thus may have a different property from that of the source area S and the drain area D. In other words, when the semiconductor layer A is plasma treated or doped with impurities, by using the upper gate electrode Gb on the third gate insulating layer 118 as a self-aligned mask, the channel area C which is not doped with impurities may be formed at a position overlapping the third gate insulating layer 118, and the source area S and the drain area D doped with impurities may be formed at both sides of the channel area C, respectively.

In an embodiment, as the first gate insulating layer 113 and the second gate insulating layer 115 are stacked on the substrate 100, the third gate insulating layer 118 may also be arranged or disposed to cover or overlap the semiconductor layer A.

As shown in FIG. 4, the gate electrodes G may be on the upper and lower portions of the semiconductor layer A, respectively. In more detail, the lower gate electrode Ga may be located or disposed with the semiconductor layer A and the first interlayer insulating layer 117 therebetween, and the upper gate electrode Gb may be located or disposed with the semiconductor layer A and the third gate insulating layer 118 therebetween. For example, the gate electrode G may be a single layer or multiple layers of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

In an embodiment, when the third gate insulating layer 118 is patterned by using the upper gate electrode Gb as a mask, the third gate insulating layer 118 may also have substantially the same shape as that of the upper gate electrode Gb.

In an embodiment, the lower gate electrode Ga may overlap the semiconductor layer A, but may overlap the channel area C and the drain area D. For example, the lower gate electrode Ga may overlap the semiconductor layer A by avoiding or being separate from or not overlapping the source area S. The lower gate electrode Ga may be disposed so as not to overlap the source area S.

The thin-film transistor T may include a second interlayer insulating layer 119 covering or overlapping the upper gate electrode Gb and the electrode layer E on the second interlayer insulating layer 119.

The electrode layer E may include a source electrode and a drain electrode. The source electrode may be electrically connected to the source area S, and the drain electrode may be electrically connected to the drain area D. The electrode layer E of FIG. 4 shows a drain electrode electrically connected to the drain area D. For example, the electrode layer E may be a single layer or multiple layers of at least one of Al, Pt, Pd, Ag, Mg, Au, Ni, Nd, Ir, Cr, Li, Ca, Mo, Ti, W, and Cu. In an embodiment, the electrode layer E may be a single layer of Mo or multiple layers of Mo/Al/Mo. The electrode layer E may be electrically connected to the data line DL and/or the driving voltage line PL.

The interlayer insulating layers 117 and 119 may include an inorganic material including oxide or nitride. For example, the interlayer insulating layers 117 and 119 may include $SiO_2$, $SiN_x$, SiON, $Al_2O_3$, $TiO_2$, $Ta_2O_5$, $HfO_2$, or $ZnO_2$.

The interlayer insulating layers 117 and 119 may include organic materials such as acryl, benzocyclobutene (BCB), polyimide, or hexamethyldisiloxane (HMDSO).

The electrode layer E may be covered with or overlapped by an inorganic protective layer (not shown). The inorganic protective layer may have a single-layered or multi-layered structure including silicon nitride ($SiN_x$) and silicon oxide ($SiO_x$). The inorganic protective layer may be introduced to cover and protect some wires on the second interlayer insulating layer 119.

In an embodiment, the lower gate electrode Ga may overlap the semiconductor layer A, but may overlap the channel area C and the drain area D. For example, the lower gate electrode Ga may overlap the semiconductor layer A by avoiding or being separate from the source area S such that the lower gate electrode Ga may be disposed so as not to overlap the source area S. This will be described in more detail with reference to FIG. 13.

Figure 13:
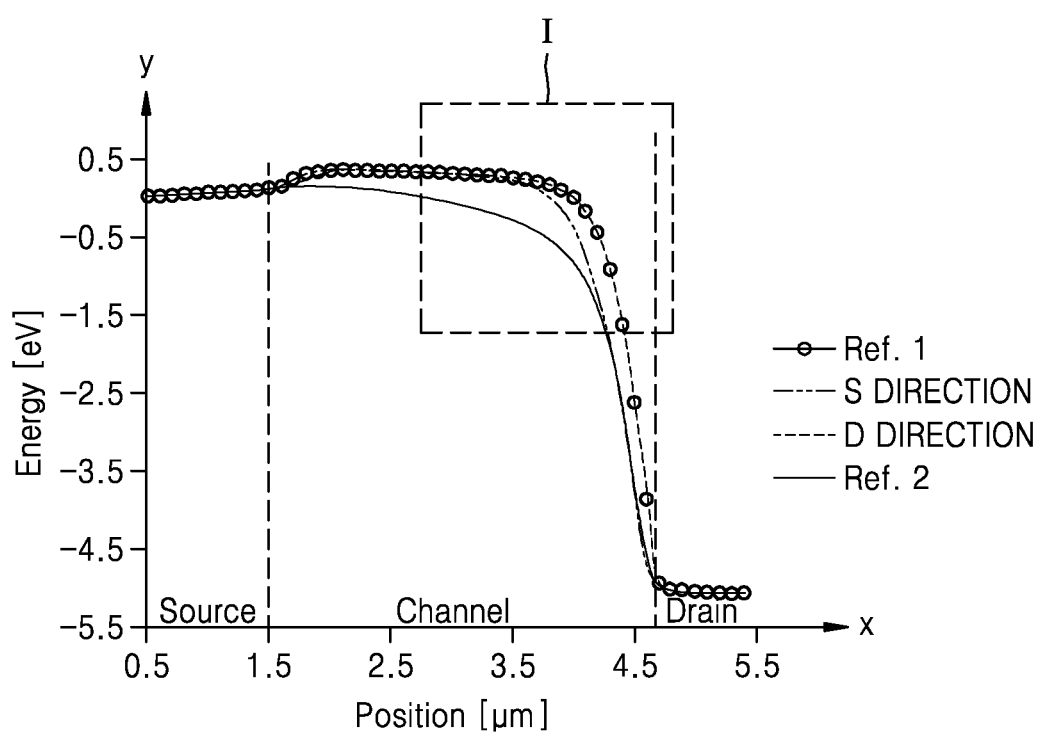
FIG. 13 is a graph illustrating a change in channel potential according to an embodiment.

FIG. 13 is a graph illustrating a change in channel potentials according to an embodiment.

Referring to FIG. 13, the semiconductor layer A may include the source area S, the channel area C, and the drain area D. An x-axis represents a position away from a point of the source area S in the semiconductor layer A, and a y-axis represents a channel potential, for example, energy according to the x-axis position. Through FIG. 13, the change in channel potential when the lower gate electrode Ga may be below the semiconductor layer A and may overlap exactly the middle of the channel area C of the semiconductor layer A (Ref. 1), when the lower gate electrode Ga moves about 1 μm toward the source area S (S direction), when the lower gate electrode Ga moves about 1 μm toward the drain area D (D direction), and when the lower gate electrode Ga does not exist (Ref. 2) may be seen.

In more detail, when the lower gate electrode Ga may be below the semiconductor layer A and overlap exactly the middle of the channel area C of the semiconductor layer A (Ref. 1), the portion where the lower gate electrode Ga may overlap the semiconductor layer A may be a part of the channel area C, the source area S, and the drain area D. For example, in FIG. 13, when the lower gate electrode Ga may be below the semiconductor layer A and overlap exactly the middle of the channel area C of the semiconductor layer A (Ref. 1), the lower gate electrode Ga may overlap the source area S and the drain area D by a width of about 1 μm, respectively, based on the schematic cross section as shown in FIG. 4.

When the lower gate electrode Ga moves about 1 μm toward the source area S (S direction), the lower gate electrode Ga may overlap the semiconductor layer A by avoiding or being separate from the drain area D such that the lower gate electrode Ga may not overlap the drain area D.

Similarly, when the lower gate electrode Ga moves about 1 μm toward the drain area D (D direction), it can be seen that the lower gate electrode Ga may overlap the semiconductor layer A by avoiding or being separate from the source area S such that the lower gate electrode Ga may not overlap the source area S.

Ideal channel potential corresponds to the shape of a unit step function symmetrical to the y axis. Referring to portion I of FIG. 13, an energy change when the lower gate electrode Ga may be below the semiconductor layer A and overlap exactly the middle of the channel area C of the semiconductor layer A (Ref. 1) may be most similar to the ideal channel potential.

When the lower gate electrode Ga does not exist (Ref. 2), a field action caused by the drain area D may be so strong that the change in channel potential may be large. The change in channel potentials when the lower gate electrode Ga moves about 1 μm toward the source area S (S direction) may be less than when the lower gate electrode Ga does not exist (Ref. 2). However, compared to the case where the lower gate electrode Ga may be below the semiconductor layer A and overlap exactly the middle of the channel area C of the semiconductor layer A (Ref. 1), the change in channel potentials may be large.

However, when the lower gate electrode Ga moves about 1 μm toward the drain area D (D direction), the change in channel potentials may remain the same as when the lower gate electrode Ga may be below the semiconductor layer A and overlap exactly the middle of the channel area C of the semiconductor layer A (Ref. 1).

As shown in FIG. 4, when the lower gate electrode Ga included in the thin-film transistor substrate TB overlaps the semiconductor layer A by avoiding or being separate from the source area S to not overlap the source area S, the change in channel potentials may remain the same as when the lower gate electrode Ga may be below the semiconductor layer A and overlap exactly the middle of the channel area C of the semiconductor layer A (Ref. 1).

When the lower gate electrode Ga avoids or is separate from the source area S and overlaps only the channel area C and the drain area D of the semiconductor layer A, the lower gate electrode Ga may maintain the same channel potential value as when the lower gate electrode Ga may overlap a portion of the channel area C and the source area S and the drain area D.

Since the lower gate electrode Ga overlaps the channel area C and the drain area D, interference with neighboring signals close to the source area S may be reduced. As a width of the lower gate electrode Ga in one direction is reduced, neighboring devices may be located or disposed closer thereto, thereby increasing resolution. This will be described in detail with reference to FIGS. 6 and 9.

Figure 5:
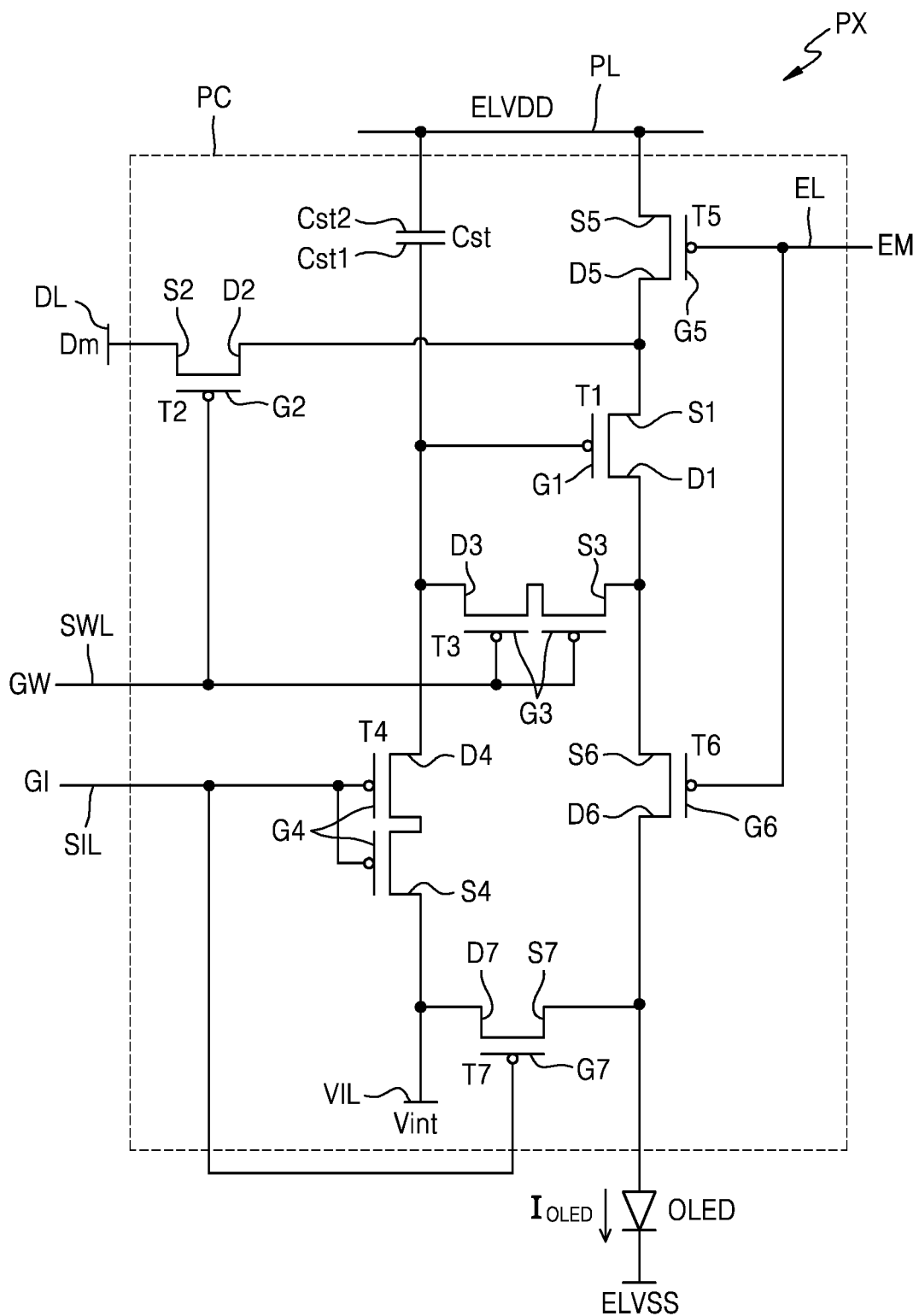
FIG. 5 is an equivalent circuit diagram of one pixel circuit of a display panel according to an embodiment.

FIG. 5 is an equivalent circuit diagram of one pixel circuit of a display panel according to an embodiment.

Referring to FIG. 5, a pixel PX may include a pixel circuit PC and the organic light-emitting diode OLED electrically connected to the pixel circuit PC. The pixel circuit PC may include thin-film transistors and a storage capacitor Cst. The thin-film transistors and the storage capacitor Cst may be electrically connected to signal lines SWL, SIL, EL, and DL, an initialization voltage line VIL, and the driving voltage line PL.

Although FIG. 5 shows that each pixel PX may be electrically connected to the signal lines SWL, SIL, EL, and DL, the initialization voltage line VIL, and the driving voltage line PL, the disclosure is not limited thereto. In an embodiment, at least one of the signal lines SWL, SIL, EL, and DL, the initialization voltage line VIL, and the driving voltage line PL may be shared by neighboring pixels.

The thin-film transistors may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

A signal line may include a scan line SWL that may transmit a scan signal GW, a previous scan line SIL that may transmit a previous scan signal GI to the first initialization thin-film transistor T4 and the second initialization thin-film transistor T7, the emission control line EL that may transmit an emission control signal EM to the operation control thin-film transistor T5 and the emission control thin-film transistor T6, and the data line DL that may transmit a data signal Dm crossing or intersecting the scan line SWL. The driving voltage line PL may transmit the first power supply voltage ELVDD to the driving thin-film transistor T1, and the initialization voltage line VIL may transmit an initialization voltage Vint that may initialize the driving thin-film transistor T1 and a pixel electrode 310 (see FIG. 6 to be described later below).

A driving gate electrode G1 of the driving thin-film transistor T1 may be electrically connected to a first storage capacitor plate Cst1 of the storage capacitor Cst, a driving source area S1 of the driving thin-film transistor T1 may be electrically connected to the driving voltage line PL through the operation control thin-film transistor T5, and a driving drain area D1 of the driving thin-film transistor T1 may be electrically connected to the pixel electrode 310 of the organic light-emitting diode OLED through the emission control thin-film transistor T6. The driving thin-film transistor T1 may receive the data signal Dm according to a switching operation of the switching thin-film transistor T2 and may supply a driving current IDLED to the organic light-emitting diode OLED.

A switching gate electrode G2 of the switching thin-film transistor T2 may be electrically connected to the scan line SWL, a switching source area S2 of the switching thin-film transistor T2 may be electrically connected to the data line DL, and a switching drain area D2 of the switching thin-film transistor T2 may be electrically connected to the driving source area S1 of the driving thin-film transistor T1 and may be electrically connected to the driving voltage line PL through the operation control thin-film transistor T5. The switching thin-film transistor T2 may be turned on in response to the scan signal GW received through the scan line SWL and may perform a switching operation that may transmit the data signal Dm transmitted to the data line DL to the driving source area S1 of the driving thin-film transistor T1.

A compensation gate electrode G3 of the compensation thin-film transistor T3 may be electrically connected to the scan line SWL, a compensation source area S3 of the compensation thin-film transistor T3 may be electrically connected to the driving drain area D1 of the driving thin-film transistor T1 and may be electrically connected to the pixel electrode 310 of the organic light-emitting element OLED through the emission control thin-film transistor T6, and a compensation drain area D3 of the compensation thin-film transistor T3 may be electrically connected to the first storage capacitor plate Cst1 of the storage capacitor Cst, first initialization drain area D4 of the first initialization thin-film transistor T4, and the driving gate electrode G1 of the driving thin-film transistor T1. The compensation thin-film transistor T3 may be turned on in response to the scan signal GW received through the scan line SWL and may electrically connect the driving gate electrode G1 of the driving thin-film transistor T1 to the driving drain area D1 to diode-connect the driving thin-film transistor T1.

A first initialization gate electrode G4 of the first initialization thin-film transistor T4 may be electrically connected to the previous scan line SIL, a first initialization source area S4 of the first initialization thin-film transistor T4 may be electrically connected to a second initialization drain area D7 of the second initialization thin-film transistor T7 and the initialization voltage line VIL, and the first initialization drain area D4 of the first initialization thin-film transistor T4 may be electrically connected to the first storage capacitor Cst1 of the storage capacitor Cst, the compensation drain area D3 of the compensation thin-film transistor T3, and the driving gate electrode G1 of the driving thin-film transistor T1. The first initialization thin-film transistor T4 may be turned on in response to a previous scan signal GI received through the previous scan line SIL and may initialize a voltage of the driving gate electrode G1 of the driving thin-film transistor T1 by transmitting the initialization voltage Vint to the driving gate electrode G1 of the driving thin-film transistor T1.

An operation control gate electrode G5 of the operation control thin-film transistor T5 may be electrically connected to the emission control line EL, an operation control source area S5 of the operation control thin-film transistor T5 may be electrically connected to the driving voltage line PL, and an operation control drain area D5 of the operation control thin-film transistor T5 may be electrically connected to the driving source area S1 of the driving thin-film transistor T1 and the switching drain area D2 of the switching thin-film transistor T2.

An emission control gate electrode G6 of the emission control thin-film transistor T6 may be electrically connected to the emission control line EL, an emission control source area S6 of the emission control thin-film transistor T6 may be electrically connected to the driving drain area D1 of the driving thin-film transistor T1 and the compensation source area S3 of the compensation thin-film transistor T3, and an emission control drain area D6 of the emission control thin-film transistor T6 may be electrically connected to a second initialization source area S7 of the second initialization thin-film transistor T7 and the pixel electrode 310 of the organic light-emitting diode OLED.

The operation control thin-film transistor T5 and the emission control thin-film transistor T6 may be simultaneously turned on in response to the emission control signal EM received through the emission control line EL so that the first supply voltage ELVDD may be transmitted to the organic light-emitting diode OLED and the driving current IDLED may flow through the organic light-emitting diode OLED.

A second initialization gate electrode G7 of the second initialization thin-film transistor T7 may be electrically connected to the previous scan line SIL, the second initialization source area S7 of the second initialization thin-film transistor T7 may be electrically connected to the emission control drain area D6 of the emission control thin-film transistor T6 and the pixel electrode 310 of the organic light-emitting diode OLED, and the second initialization drain area D7 of the second initialization thin-film transistor T7 may be electrically connected to the first initialization source area S4 of the first initialization thin-film transistor T4 and the initialization voltage line VIL. The second initialization thin-film transistor T7 may be turned on in response to the previous scan signal GI received through the previous scan line SIL to initialize the pixel electrode 310 of the organic light-emitting diode OLED.

Although FIG. 5 describes a case where the first initialization thin-film transistor T4 and the second initialization thin-film transistor T7 may be electrically connected to the previous scan line SIL, the disclosure is not limited thereto. In an embodiment, the first initialization thin-film transistor T4 may be electrically connected to the previous scan line SIL and driven according to the previous scan signal GI, and the second initialization thin-film transistor T7 may be electrically connected to a separate signal line (for example, next scan line) and driven according to a signal transmitted to the signal line.

A second storage capacitor plate Cst2 of the storage capacitor Cst may be electrically connected to the driving voltage line PL and the opposite electrode 330 (see FIG. 6 to be described later below) of the organic light-emitting diode OLED may be electrically connected to the second power supply voltage ELVSS. Accordingly, the organic light-emitting diode OLED may receive the driving current IDLED from the driving thin-film transistor T1 and emit light to display an image.

FIG. 5 shows that the compensation thin-film transistor T3 and the first initialization thin-film transistor T4 may have a dual gate electrode. However, the compensation thin-film transistor T3 and the first initialization thin-film transistor T4 may have one gate electrode.

FIG. 5 illustrates that the pixel circuit PC includes seven thin-film transistors and one storage capacitor, but the disclosure is not limited thereto. The number of thin-film transistors and the number of storage capacitors may be variously changed, such as six or less or eight or more, depending on the design of the pixel circuit PC.

Figure 6:
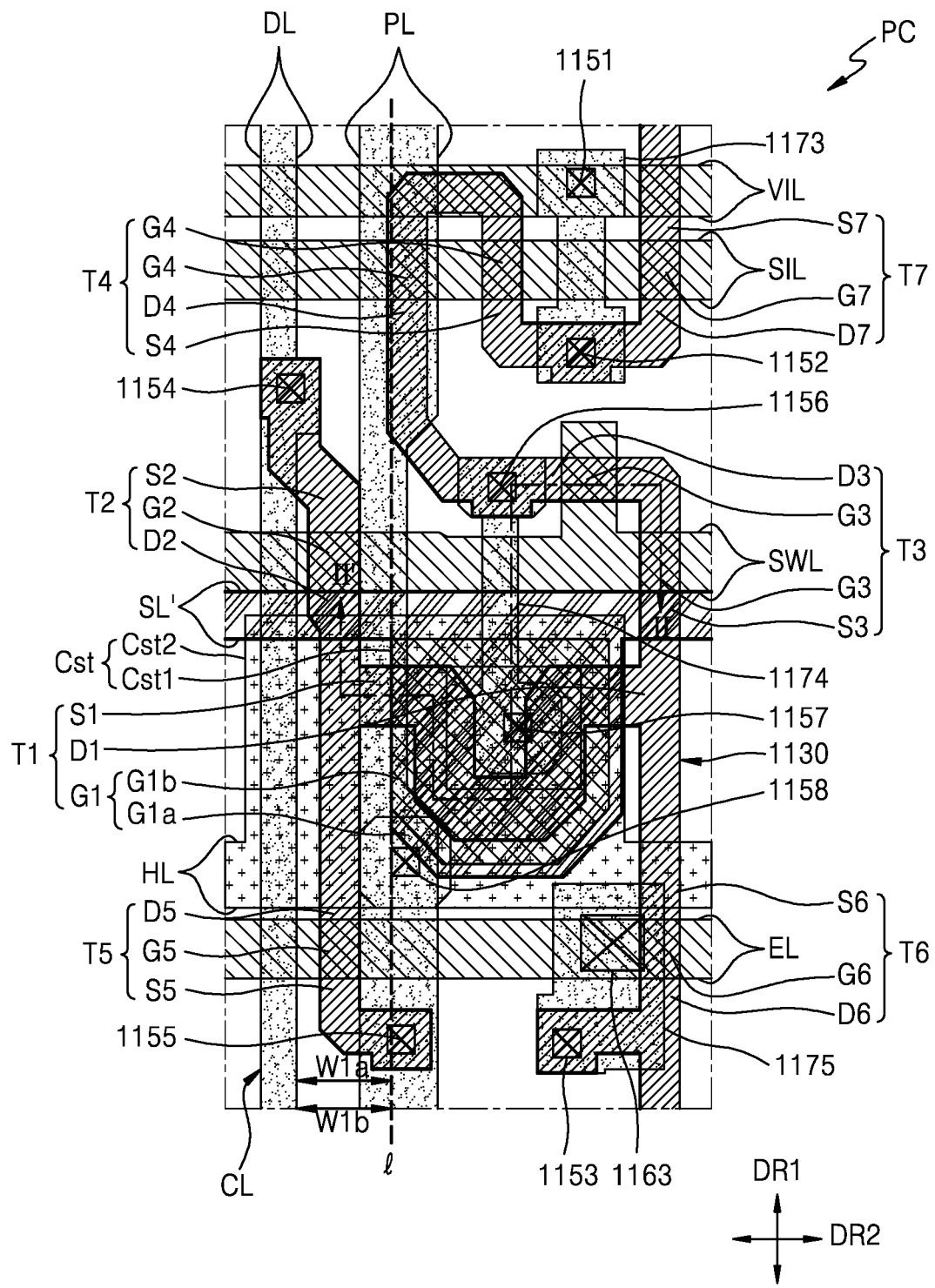
FIG. 6 is a plan view of one pixel circuit of a display panel according to an embodiment.
Figure 7:
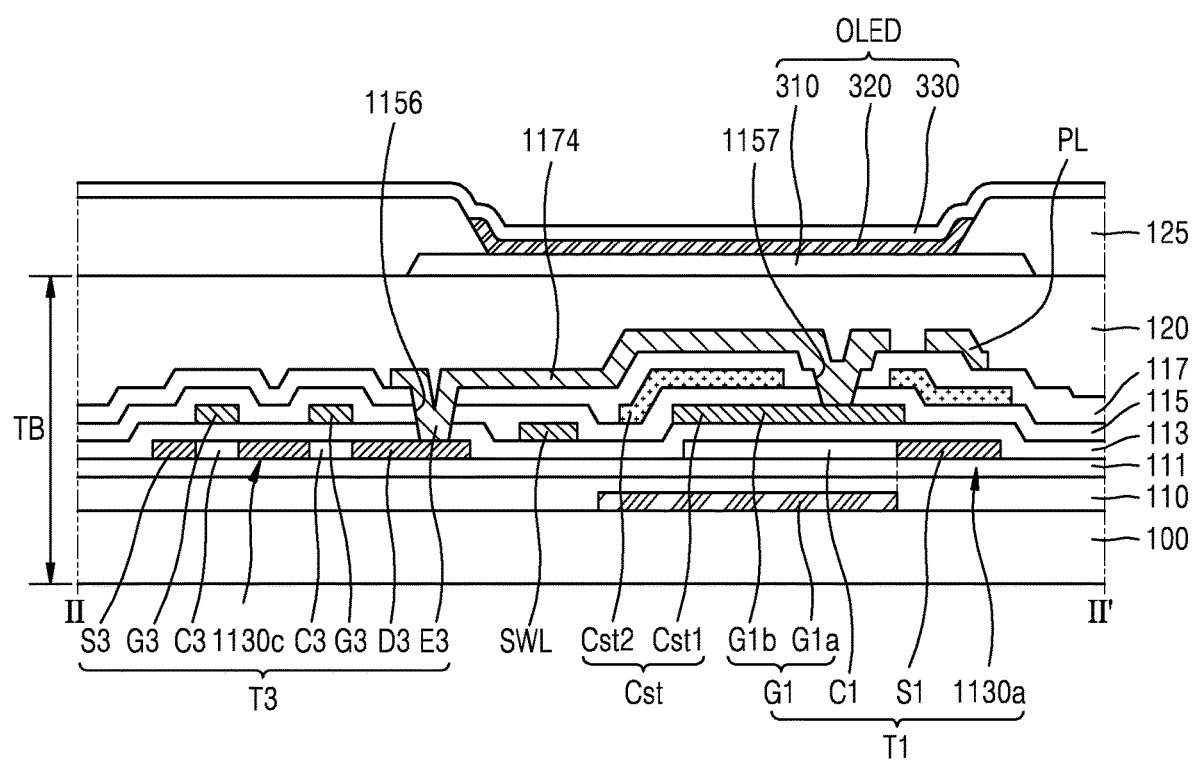
FIG. 7 is a schematic cross-sectional view of the pixel circuit taken along line II-II' of FIG. 6.

FIG. 6 is a plan view of one pixel circuit of a display panel according to an embodiment and FIG. 7 is a schematic cross-sectional view of the pixel circuit taken along line II-II' of FIG. 6. In FIG. 7, the same reference numerals as those in FIG. 4 denote the same elements. Furthermore, FIG. 7 mainly illustrates a structure of the driving thin-film transistor T1, the compensation thin-film transistor T3, and the storage capacitor Cst, and some members or elements may be omitted.

Referring to FIGS. 6 and 7, the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 may be arranged or disposed along a semiconductor layer 1130. The semiconductor layer 1130 may be disposed on the substrate 100, the barrier layer 110 may include an inorganic material such as oxide or nitride, an organic material, or an organic-inorganic composite, and a buffer layer 111 may include an inorganic material such as silicon oxide, silicon nitride, and silicon oxynitride.

In an embodiment, a lower gate electrode G1a of the driving thin-film transistor T1 and a separate signal line SL' may be included or disposed between the barrier layer 110 and the buffer layer 111. The lower gate electrode G1a and the separate signal line SL' of the driving thin-film transistor T1 may include a metal such as Mo, Al, Cu, Ti, and an alloy thereof. The separate signal line SL' may extend in the second direction DR2.

Some areas or portions of the semiconductor layer 1130 may correspond to semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. In other words, it may be understood that the semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 may be electrically connected to each other and bent in various shapes. FIG. 7 illustrates a driving semiconductor layer 1130a of the driving thin-film transistor T1 and a compensation semiconductor layer 1130c of the compensation thin-film transistor T3 corresponding to a portion of the semiconductor layer 1130.

The semiconductor layer 1130 may include amorphous silicon or polysilicon. In an embodiment, the semiconductor layer 1130 may include an oxide of at least one of In, Ga, Sn, Zr, V, Hf, Cd, Ge, Cr, Ti, Al, Cs, Ce, and Zn.

The semiconductor layer 1130 may include a channel area and a source area and a drain area on both sides of the channel area, wherein the source area and the drain area may be understood as a source electrode and a drain electrode of a corresponding thin-film transistor. Hereinafter, the terms source area and drain area may be used instead of the source electrode and the drain electrode.

The semiconductor layer 1130 may be formed of a single layer or multiple layers, and a thin-film transistor may include an electrode layer (for example, E3 in FIG. 7) electrically connected to at least one of a source area and a drain area.

The driving thin-film transistor T1 may include an upper gate electrode G1b of the driving thin-film transistor T1 overlapping a driving channel area C1 and the driving source area S1 and the driving drain area D1 at both sides of the driving channel area C1. The driving channel area C1 overlapping the upper gate electrode G1b of the driving thin-film transistor T1 may have a substantially bent shape such as an omega or arch shape to form a long channel length in a narrow space. When the driving channel area C1 is long, a driving range of a gate voltage may be widened, so that the gradation of light emitted from the organic light-emitting diode OLED (see FIG. 7) may be more precisely controlled and display quality may be improved.

In an embodiment, the lower gate electrode G1a of the driving thin-film transistor T1 may overlap the driving channel area C1 and the driving drain area D1. As shown in FIG. 7, the lower gate electrode G1a of the driving thin-film transistor T1 may have substantially the same shape as that of the upper gate electrode G1b of the driving thin-film transistor T1, but may be greater than the upper gate electrode G1b of the driving thin-film transistor T1 at the remaining portion except the end adjacent to the driving source area S1. For example, the lower gate electrode G1a of the driving thin-film transistor T1 may not exist below the driving source area S1 in a plan view.

The switching thin-film transistor T2 may include the switching gate electrode G2 overlapping a switching channel area, and the switching source area S2 and the switching drain area D2 on both sides of the switching channel area. The switching drain area D2 may be electrically connected to the driving source area S1.

The compensation thin-film transistor T3 may be a dual thin-film transistor having compensation gate electrodes G3 overlapping two compensation channel areas C3, and may include the compensation channel area C3 and the compensation drain area D3 on both sides of the compensation gate electrodes G3. The compensation thin-film transistor T3 may be electrically connected to the upper gate electrode G1b of the driving thin-film transistor T1 through a node connecting line 1174 to be described later below.

The first initialization thin-film transistor T4 may be a dual thin-film transistor having the first initialization gate electrodes G4 overlapping two first initialization channel areas, and may include the first initialization source area S4 and the first initialization drain area D4 on both sides of the first initialization gate electrodes G4.

The operation control thin-film transistor T5 may include the operation control gate electrode G5 overlapping an operation control channel area, and may include the operation control source area S5 and the operation control drain area D5 on both sides of the operation control gate electrode G5. The operation control drain area D5 may be electrically connected to the driving source area S1.

The emission control thin-film transistor T6 may include the emission control gate electrode G6 overlapping an emission control channel area, and may include the emission control source area S6 and the emission control drain area D6 on both sides of the emission control gate electrode G6. The emission control source area S6 may be electrically connected to the driving drain area D1.

The second initialization thin-film transistor T7 may include the second initialization gate electrode G7 overlapping a second initialization channel area, and the second initialization source area S7 and the second initialization drain area D7 on both sides of the second initialization gate electrode G7.

The thin-film transistors described above may be electrically connected to the signal lines SWL, SIL, EL, and DL, the initialization voltage line VIL, and the driving voltage line PL.

The first gate insulating layer 113 may be disposed on the semiconductor layer 1130 described above, and the scan line SWL, the previous scan line SIL, the emission control line EL, the upper gate electrode G1b of the driving thin-film transistor T1, and the initialization voltage line VIL may be disposed on the first gate insulating layer 113. The first gate insulating layer 113 may include an inorganic material such as silicon oxide, silicon nitride, or silicon oxynitride. The scan line SWL, the previous scan line SIL, the emission control line EL, the upper gate electrode G1b of the driving thin-film transistor T1, and the initialization voltage line VIL may include a metal such as Mo, Al, Cu, Ti, and an alloy thereof.

The scan line SWL may extend in the second direction DR2. Some areas or portions of the scan line SWL may correspond to the switching and compensation gate electrodes G2 and G3. For example, areas of the scan line SWL overlapping channel areas of the switching and compensation thin-film transistors T2 and T3 may be the switching and compensation gate electrodes G2 and G3, respectively.

The previous scan line SIL may extend in the second direction DR2, and some areas or portions of the previous scan line SIL may correspond to the first and second initialization gate electrodes G4 and G7, respectively. For example, some areas or portions of the previous scan line SIL overlapping channel areas of the first and second initialization driving thin-film transistors T4 and T7 may be the first and second initialization gate electrodes G4 and G7, respectively.

The emission control line EL may extend in the second direction DR2. Some areas or portions of the emission control line EL may correspond to the operation control and emission control gate electrodes G5 and G6, respectively. For example, some areas or portions of the emission control line EL overlapping channel areas of the operation control and emission control thin-film transistors T5 and T6 may be the operation control and emission control gate electrodes G5 and G6, respectively.

The upper gate electrode G1b of the driving thin-film transistor T1 may be a floating electrode and may be electrically connected to the compensation thin-film transistor T3 through the node connecting line 1174.

The initialization voltage line VIL may extend in the second direction DR2. The initialization voltage line VIL may be electrically connected to the first and second initialization driving thin-film transistors T4 and T7 through an initialization connecting line 1173.

Figure 11A:
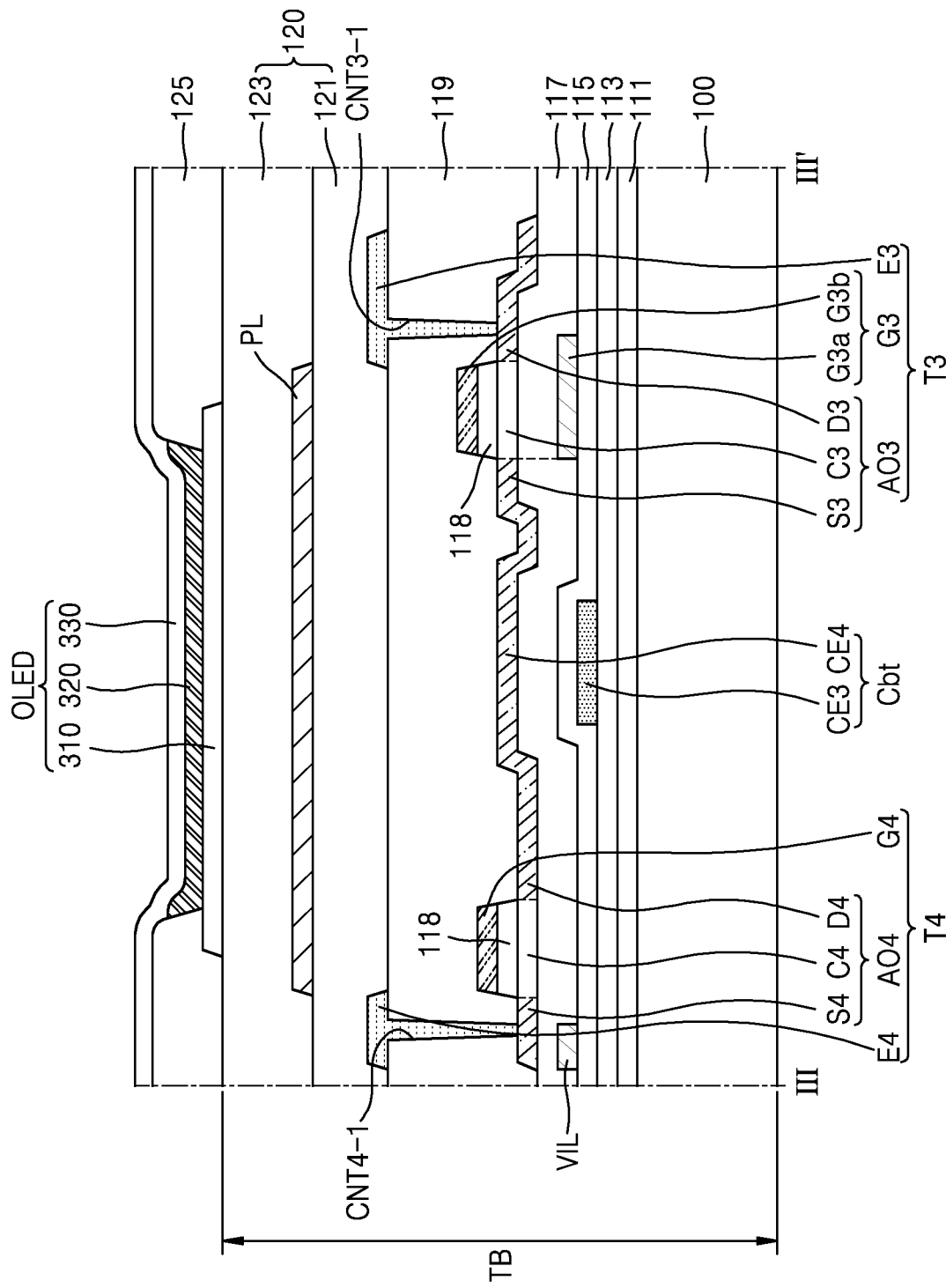
FIGS. 11A and 11B are schematic cross-sectional views of the pixel circuit taken along line III-III' of FIG. 9.

In FIG. 11A, the initialization voltage line VIL may be disposed on the first gate insulating layer 113. However, in an embodiment, the initialization voltage line VIL may be disposed on a planarization layer 120 and may include the same or similar material as that of the pixel electrode 310.

An electrode voltage line HL may be on the above-described scan line SWL, the previous scan line SIL, the emission control line EL, the upper gate electrode G1b of the driving thin-film transistor T1, and the initialization voltage line VIL with the second gate insulating layer 115 including an inorganic material disposed therebetween. The second gate insulating layer 115 may include $SiO_2$, $SiN_x$, SiON, $Al_2O_3$, $TiO_2$, $Ta_2O_5$, $HfO_2$, or $ZnO_2$.

A portion of the electrode voltage line HL may cover or overlap at least a portion of the upper gate electrode G1b of the driving thin-film transistor T1 and may form the storage capacitor Cst together with the upper gate electrode G1b of the driving thin-film transistor T1. For example, the upper gate electrode G1b of the driving thin-film transistor T1 may be the first storage capacitor plate Cst1 of the storage capacitor Cst and a portion of the electrode voltage line HL may be the second storage capacitor plate Cst2 of the storage capacitor Cst.

The driving voltage line PL and the second storage capacitor plate Cst2 may be electrically connected to the driving voltage line PL. In this regard, FIG. 6 shows that the electrode voltage line HL may be electrically connected to the driving voltage line PL on the electrode voltage line HL through a contact hole 1158. The electrode voltage line HL may have the same voltage level (constant voltage, for example, about +5V) as that of the driving voltage line PL. The electrode voltage line HL may be understood as a kind of lateral driving voltage line.

Since the driving voltage line PL may extend in a first direction DR1 and the electrode voltage line HL that may be electrically connected to the driving voltage line PL may extend in the second direction DR2 crossing or intersecting the first direction DR1, driving voltage lines PL and electrode voltage lines HL may form a mesh structure in a display area.

A conductive layer CL may be disposed on the second storage capacitor plate Cst2 and the electrode voltage line HL with the first interlayer insulating layer 117 including an inorganic material disposed therebetween. The conductive layer CL may include the data line DL, the driving voltage line PL, the initialization connecting line 1173, and the node connecting line 1174. The data line DL, the driving voltage line PL, the initialization connecting line 1173, and the node connecting line 1174 may include Al, Cu, Ti, and the like, and may be a single layer or multiple layers. In an embodiment, the driving voltage line PL and the data line DL may have a multilayer structure of Ti/Al/Ti.

The data line DL may extend in the first direction DR1 and may be electrically connected to the switching source area S2 of the switching thin-film transistor T2 through a contact hole 1154. A portion of the data line DL may be understood as a switching source area.

The driving voltage line PL may extend in the first direction DR1 and may be electrically connected to the electrode voltage line HL through the contact hole 1158 as described above. As an example, the driving voltage line PL may be electrically connected to the operation control thin-film transistor T5 through a contact hole 1155. The driving voltage line PL may be electrically connected to the operation control source area S5 through the contact hole 1155.

One end of the initialization connecting line 1173 may be electrically connected to the first and second initialization thin-film transistors T4 and T7 through a contact hole 1152 and the other end may be electrically connected to the initialization voltage line VIL described above through a contact hole 1151.

One end of the node connecting line 1174 may be electrically connected to the compensation drain area D3 through a contact hole 1156 and a compensation electrode layer E3, and the other end may be electrically connected to the upper gate electrode G1$b$ of the driving thin-film transistor T1 through a contact hole 1157.

The planarization layer 120 may be disposed on the data line DL, the driving voltage line PL, the initialization connecting line 1173, and the node connecting line 1174, and the planarization layer 120 may include a general purpose polymer such as benzocyclobutene (BCB), polyimide (PI), hexamethyldisiloxane (HMDSO), polymethylmethacrylate (PMMA), and polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof. The organic light-emitting diode OLED may be disposed on the planarization layer 120. The organic light-emitting diode OLED may include the pixel electrode 310, an intermediate layer 320 including an organic light-emitting layer, and an opposite electrode 330.

Referring to FIG. 7, an edge of the pixel electrode 310 may be covered with or overlapped by a pixel-defining layer 125 on the planarization layer 120, and a central area of the pixel electrode 310 may be exposed through an opening of the pixel-defining layer 125. The pixel defining layer 125 may be formed by spin coating or the like with one or more organic insulating materials from among polyimide, polyamide, acrylic resin, benzocyclobutene, and phenolic resin. The pixel electrode 310 may include Ag, Mg, Al, Pt, Pd, Au, Ni, Nd, Ir, Cr, or a reflective film including a compound thereof. In an embodiment, the pixel electrode 310 may include a film formed of ITO, IZO, ZnO, or $In_2O_3$ above/below the reflective layer. The intermediate layer 320 may be disposed on the pixel electrode 310 exposed through the opening.

An intermediate layer 320 of the organic light-emitting diode OLED may include an organic emission layer. The organic emission layer may include an organic material including a fluorescent or phosphorescent material that may emit red, green, blue, or white light. The organic emission layer may include a low-molecular weight organic material or a high-molecular weight organic material. Although not illustrated, a functional layer such as a hole transport layer (HTL), a hole injection layer (HIL), an electron transport layer (ETL), or an electron injection layer (EIL) may selectively be arranged or disposed over and below the organic emission layer. The intermediate layer 320 may be arranged or disposed corresponding to each of pixel electrodes 310. However, the disclosure is not limited thereto. The intermediate layer 320 may include a layer that may be integral with the pixel electrodes 310 and various modifications may be made within the spirit and the scope of the disclosure.

The opposite electrode 330 may be arranged or disposed to face the pixel electrode 310 with the intermediate layer 320 disposed therebetween. The opposite electrode 330 may include a conductive material having a low work function. For example, the opposite electrode 330 may include a (semi) transparent layer including Ag, Mg, Al, Pt, Pd, Au, Ni, Nd, Ir, Cr, Li, Ca, or an alloy thereof. Alternatively, the opposite electrode 330 may include a layer such as ITO, IZO, ZnO, or $In_2O_3$ on the (semi) transparent layer including the above-mentioned materials.

Referring to FIGS. 6 and 7, the thin-film transistor substrate TB according to an embodiment may include the driving thin-film transistor T1. The lower gate electrode G1$a$ of the driving thin-film transistor T1 may overlap the driving semiconductor layer 1130$a$, but may overlap the driving channel area C1 and the driving drain area D1. For example, the lower gate electrode G1$a$ of the driving thin-film transistor T1 may be disposed so as not to overlap the driving source area S1 and may overlap the driving semiconductor layer 1130$a$ by avoiding or being separate from the driving source area S1.

In this case, since a value close to ideal channel potential as described with respect to FIG. 13 may be maintained and the lower gate electrode G1$a$ of the driving thin-film transistor T1 may overlap the driving channel area C1 and the driving drain area D1, the interference with a neighboring signal close to the driving source area S1 may be reduced.

Since the area of the lower gate electrode G1$a$ of the driving thin-film transistor T1 may be reduced as the driving source area S1 may be avoided, neighboring devices may be arranged or disposed closer thereto. For example, the area of the pixel circuit PC may be reduced and the resolution may be increased.

In an embodiment, devices arranged or disposed on the left side with respect to a straight line/extending in the first direction DR1 of FIG. 6 may be moved by about 1 μm to the right of the second direction DR2. As a result, the length of the second direction DR2 per pixel circuit PC may be reduced by about 1 μm, so that more pixel circuits PC may be arranged or disposed in the thin-film transistor substrate TB, thus resulting in high resolution.

Referring to the straight line/extending in the first direction DR1 of FIG. 6, an end of the upper gate electrode G1b of the driving thin-film transistor T1 adjacent to the driving source area S1 may coincide with an end of the lower gate electrode G1a of the driving thin-film transistor T1 in a plan view.

In an embodiment, the thin-film transistor substrate TB may include the conductive layer CL arranged or disposed in the first direction DR1. The data line DL may be included as a portion of the conductive layer CL. A gap W1a between the lower gate electrode G1a of the driving thin-film transistor T1 and the data line DL in a plan view may be equal to a gap W1b between the upper gate electrode G1b of the driving thin-film transistor T1 and the data line DL.

FIGS. 6 and 7 illustrate that the driving thin-film transistor T1 may have the lower gate electrode G1a of the driving thin-film transistor T1, but other thin-film transistors T2 to T7 may also have a lower gate electrode and the lower gate electrodes may overlap a semiconductor layer by avoiding or being separate from each source area.

Figure 8:
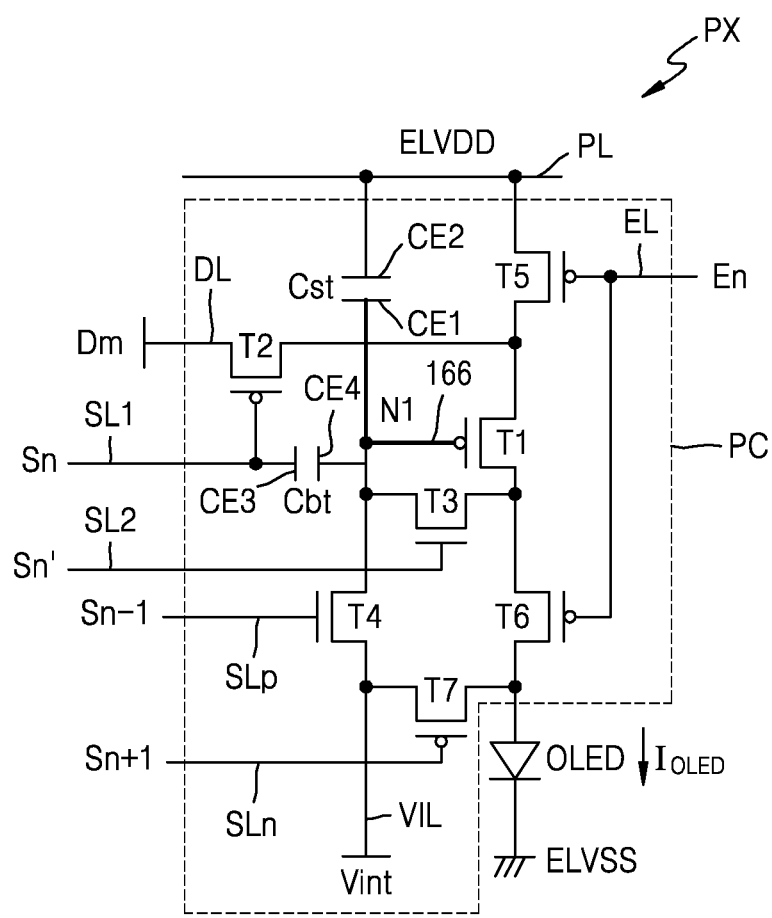
FIG. 8 is an equivalent circuit diagram of one pixel circuit of a display panel according to an embodiment.

FIG. 8 is an equivalent circuit diagram of one pixel circuit of a display panel according to an embodiment.

Referring to FIG. 8, the pixel PX may include signal lines SL1, SL2, SLp, SLn, EL, and DL, and thin-film transistors T1, T2, T3, T4, T5, and T6, and T7 electrically connected to the signal lines, the storage capacitor Cst, a boost capacitor Cbt, the initialization voltage line VIL, the driving voltage line PL, and the organic light-emitting diode OLED as a display element. In an embodiment, at least one of the signal lines SL1, SL2, SLp, SLn, EL, and DL, for example, the initialization voltage line VIL and/or the driving voltage line PL may be shared by neighboring pixels PX.

A thin-film transistor may include the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7.

Some of the thin-film transistors T1, T2, T3, T4, T5, T6, and T7 may be provided as an n-channel MOSFET (NMOS), and the remaining thin film transistors may be provided as a p-channel MOSFET (PMOS).

For example, as shown in FIG. 8, the compensation thin-film transistor T3 and the first initialization thin-film transistor T4 among the thin-film transistors T1, T2, T3, T4, T5, T6, and T7 may be provided as the NMOS, and the remaining may be provided as the PMOS.

In an embodiment, the compensation thin-film transistor T3, the first initialization thin-film transistor T4, and the second initialization thin-film transistor T7 among the thin-film transistors T1, T2, T3, T4, T5, T6, and T7 may be provided as the NMOS, and the remaining may be provided as the PMOS. Alternatively, only one of the thin-film transistors T1, T2, T3, T4, T5, T6, and T7 may be provided as the NMOS, and the remaining may be provided as the PMOS. Alternatively, the thin-film transistors T1, T2, T3, T4, T5, T6, and T7 may be provided as the NMOS.

A signal line may include a first scan line SL1 transmitting a first scan signal Sn, a second scan line SL2 transmitting a second scan signal Sn', a previous scan line SLp transmitting a previous scan signal Sn−1 to the first initialization thin-film transistor T4, the emission control line EL transmitting an emission control signal En to the operation control thin-film transistor T5 and the emission control thin-film transistor T6, a next scan line SLn transmitting a next scan signal Sn+1 to the second initialization thin-film transistor T7, and the data line DL that may cross or intersect the first scan line SL1 and may transmit the data signal Dm.

The driving voltage line PL may transmit the first power supply voltage ELVDD to the driving thin-film transistor T1, and the initialization voltage line VIL may transmit the initialization voltage Vint that may initialize the driving thin-film transistor T1 and a pixel electrode.

A driving gate electrode of the driving thin-film transistor T1 may be electrically connected to the storage capacitor Cst, a driving source area of the driving thin-film transistor T1 may be electrically connected to the driving voltage line PL via the operation control thin-film transistor T5, and a driving drain area of the driving thin-film transistor T1 may be electrically connected to a pixel electrode of the organic light-emitting diode OLED through the light emitting control thin-film transistor T6. The driving thin-film transistor T1 may receive the data signal Dm according to a switching operation of the switching thin-film transistor T2 and may supply a driving current IDLED to the organic light-emitting diode OLED.

A switching gate electrode of the switching thin-film transistor T2 may be electrically connected to the first scan line SL1, a switching source area of the switching thin-film transistor T2 may be electrically connected to the data line DL, and a switching drain area of the switching thin-film transistor T2 may be electrically connected to the driving source area of the driving thin-film transistor T1 and may be electrically connected to the driving voltage line PL through the operation control thin-film transistor T5. The switching thin-film transistor T2 may be turned on in response to the first scan signal Sn received through the first scan line SL1 and may perform a switching operation that may transmit the data signal Dm transmitted to the data line DL to the driving source area of the driving thin-film transistor T1.

A compensation gate electrode of the compensation thin-film transistor T3 may be electrically connected to the second scan line SL2. A compensation drain area of the compensation thin-film transistor T3 may be electrically connected to the driving drain area of the driving thin-film transistor T1 and may be electrically connected to the pixel electrode of the organic light-emitting diode OLED through the emission control thin-film transistor T6. A compensation source area of the compensation thin-film transistor T3 may be electrically connected to a first electrode CE1 of the storage capacitor Cst and the driving gate electrode of the driving thin-film transistor T1 through a node connecting line 166. The compensation source area S3 may be electrically connected to a first initialization drain area of the first initialization thin-film transistor T4.

The compensation thin-film transistor T3 may be turned on in response to the second scan signal Sn' received through the second scan line SL2 and may electrically connect a driving drain area to the driving gate electrode of the driving thin-film transistor T1 to diode-connect the driving thin-film transistor T1.

A first initialization gate electrode of the first initialization thin-film transistor T4 may be electrically connected to the previous scan line SLp. A first initialization source area of the first initialization thin-film transistor T4 may be electrically connected to a second initialization source area of the second initialization thin-film transistor T7 and the initialization voltage line VIL. The first initialization drain area of the first initialization thin-film transistor T4 may be electrically connected to the first electrode CE1 of the storage capacitor Cst, the compensation source area of the compensation thin-film transistor T3, and the driving gate electrode of the driving thin-film transistor T1. The first initialization thin-film transistor T4 may be turned on in response to the previous scan signal Sn−1 received through the previous scan line SLp and may initialize a voltage of the driving gate electrode of the driving thin-film transistor T1 by transmitting the initialization voltage Vint to the driving gate electrode G1 of the driving thin-film transistor T1.

An operation control gate electrode of the operation control thin-film transistor T5 may be electrically connected to the emission control line EL, an operation control source area of the operation control thin-film transistor T5 may be electrically connected to the driving voltage line PL, and an operation control drain area of the operation control thin-film transistor T5 may be electrically connected to a driving source area of the driving thin-film transistor T1 and a switching drain area of the switching thin-film transistor T2.

An emission control gate electrode of the emission control thin-film transistor T6 may be electrically connected to the emission control line EL, an emission control source area of the emission control thin-film transistor T6 may be electrically connected to the driving drain area of the driving thin-film transistor T1 and the compensation drain area of the compensation thin-film transistor T3, and an emission control drain area of the emission control thin-film transistor T6 may be electrically connected to a second initialization drain area of the second initialization thin-film transistor T7 and the pixel electrode of the organic light-emitting diode OLED.

The operation control thin-film transistor T5 and the emission control thin-film transistor T6 may be simultaneously turned on in response to the emission control signal En received through the emission control line EL so that the first power supply voltage ELVDD may be transmitted to the organic light-emitting diode OLED and the driving current IDLED may flow through the organic light-emitting diode OLED.

The second initialization gate electrode G7 of the second initialization thin-film transistor T7 may be electrically connected to the next scan line SLn, the second initialization drain area of the second initialization thin-film transistor T7 may be electrically connected to the emission control drain area of the emission control thin-film transistor T6 and the pixel electrode of the organic light-emitting diode OLED, and a second initialization source area of the second initialization thin-film transistor T7 may be electrically connected to the first initialization source area of the first initialization thin-film transistor T4 and the initialization voltage line VIL. The second initialization thin-film transistor T7 may be turned on in response to the next scan signal Sn+1 received through the next scan signal Sn+1 to initialize the pixel electrode of the organic light-emitting diode OLED.

The second initialization thin-film transistor T7 may be electrically connected to the scan line SLn as shown in FIG. 8. In an embodiment, the second initialization thin-film transistor T7 may be electrically connected to the emission control line EL and may be driven according to the emission control signal En. Meanwhile, positions of source and drain areas of FIG. 7 may be changed depending on the type of a transistor (p-type or n-type).

The storage capacitor Cst may include the first electrode CE1 and a second electrode CE2. The first electrode CE1 of the storage capacitor Cst may be electrically connected to the driving gate electrode of the driving thin-film transistor T1, and the second electrode CE2 of the storage capacitor Cst may be electrically connected to the driving voltage line PL. The storage capacitor Cst may store a charge corresponding to a difference between a driving gate electrode voltage of the driving thin-film transistor T1 and the first power supply voltage ELVDD.

A boost capacitor Cbt may include a third electrode CE3 and a fourth electrode CE4. The third electrode CE3 may be electrically connected to the switching gate electrode of the switching thin-film transistor T2 and the first scan line SL1, and the fourth electrode CE4 may be electrically connected to the compensation source area of the compensation thin-film transistor T3 and the node connecting line 166. The boost capacitor Cbt may increase a voltage of a first node N1 when the first scan signal Sn supplied to the first scan line SL1 may be turned off. As such, when the voltage of the first node N1 is increased, black grayscale may be clearly expressed.

The first node N1 may be the driving gate electrode of the driving thin-film transistor T1, a source area of the compensation thin-film transistor T3, a drain area of the first initialization thin-film transistor T4, and an area to which the fourth electrode CE4 of the boost capacitor Cbt may be electrically connected.

An operation of each pixel PX according to an embodiment may be as follows.

When the previous scan signal Sn−1 is supplied through the previous scan signal Sn−1 during an initialization period, the first initialization thin-film transistor T4 may be turned on in response to the previous scan signal Sn−1, and the initialization voltage Vint supplied from the initialization voltage line VIL may initialize the driving thin-film transistor T1.

When the first scan signal Sn and the second scan signal Sn' are supplied through the first scan line SL1 and the second scan line SL2 during a data programming period, the switching thin-film transistor T2 and the compensation thin-film transistor T3 may be turned on in response to the first scan signal Sn and the second scan signal Sn'. Here, the driving thin-film transistor T1 may be diode-connected when the compensation thin-film transistor T3 may be turned on, and may be biased in the forward direction.

A compensation voltage Dm+Vth (Vth is negative value) reduced by a threshold voltage Vth of the driving thin-film transistor T1 in the data signal Dm supplied from the data line DL may be applied to the driving gate electrode G1 of the driving thin-film transistor T1.

The first power supply voltage ELVDD and the compensation voltage Dm+Vth may be applied to both ends of the storage capacitor Cst, and a charge corresponding to a voltage difference between the both ends may be stored in the storage capacitor Cst.

During a light emission period, the operation control thin-film transistor T5 and the emission control thin-film transistor T6 may be turned on by the emission control signal En supplied from the emission control line EL. The driving current IDLED corresponding to a difference between the voltage of the driving gate electrode G1 of the first thin-film transistor T1 and the first power supply voltage ELVDD may be generated, and the driving current IDLED may be supplied to the organic light-emitting diode OLED through the emission control thin-film transistor T6.

In an embodiment, at least one of the thin-film transistors T1, T2, T3, T4, T5, T6, and T7 may include a semiconductor layer including oxide, and the others may include a semiconductor layer including silicon.

In more detail, a driving thin-film transistor directly affecting brightness of a display apparatus may include a semiconductor layer composed of polycrystalline silicon having high reliability, thereby realizing a high-resolution display apparatus.

Meanwhile, since an oxide semiconductor has high carrier mobility and a low leakage current, a voltage drop may not be great even if a driving time may be long. For example, since a color change of an image due to a voltage drop may not be great even in low frequency driving, low frequency driving may be possible.

As such, since an oxide semiconductor has a less leakage current, at least one of the compensation thin-film transistor T3, the first initialization thin-film transistor T4, and the second initialization thin-film transistor T7 electrically connected to the driving gate electrode G1 of the driving thin-film transistor T1 may be used as an oxide semiconductor to prevent a leakage current from flowing to the driving gate electrode G1 and may reduce power consumption.

Figure 9:
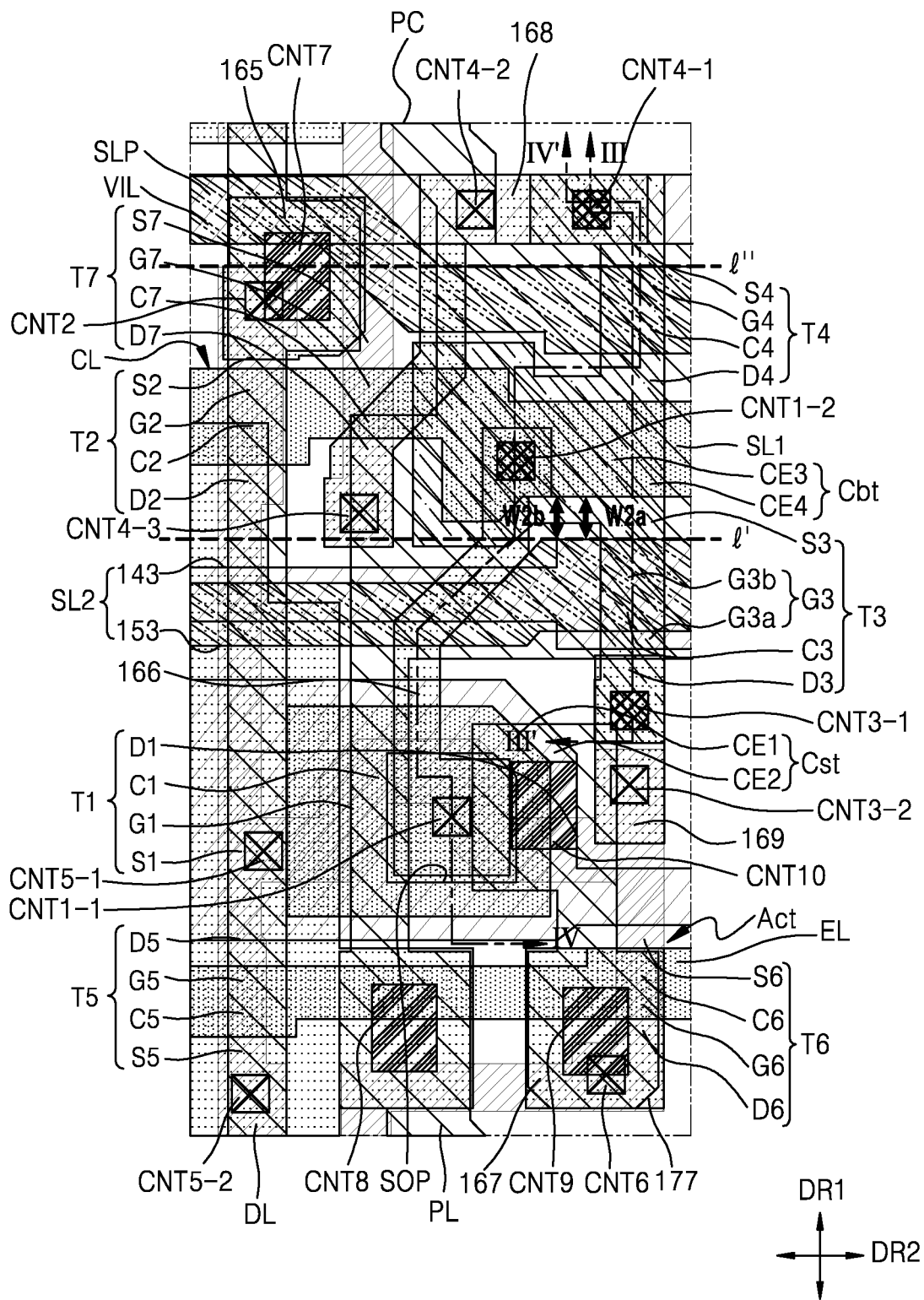
FIG. 9 is a plan view of one pixel circuit of a display panel according to an embodiment.
Figure 11B:
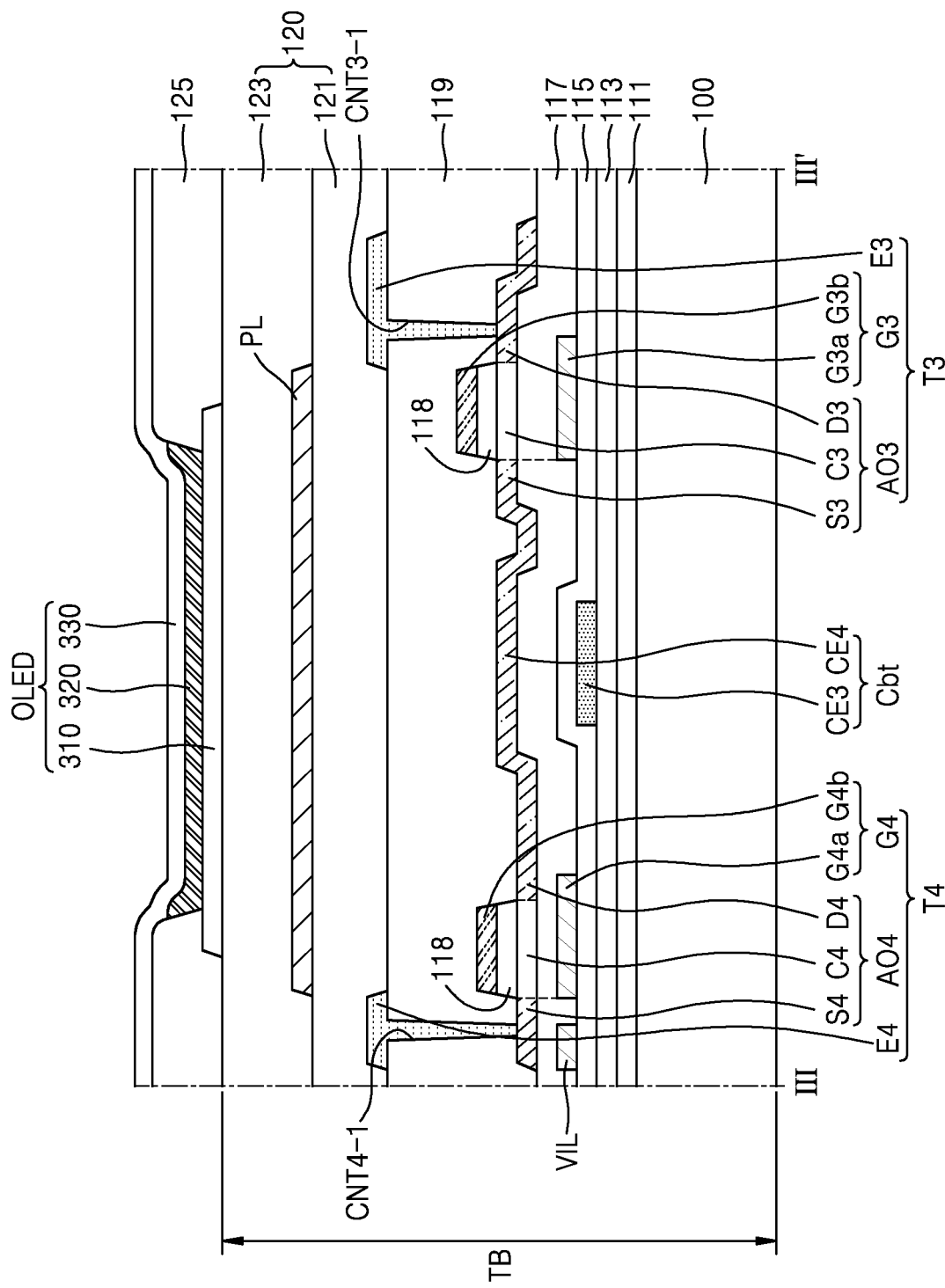
Figure 12:
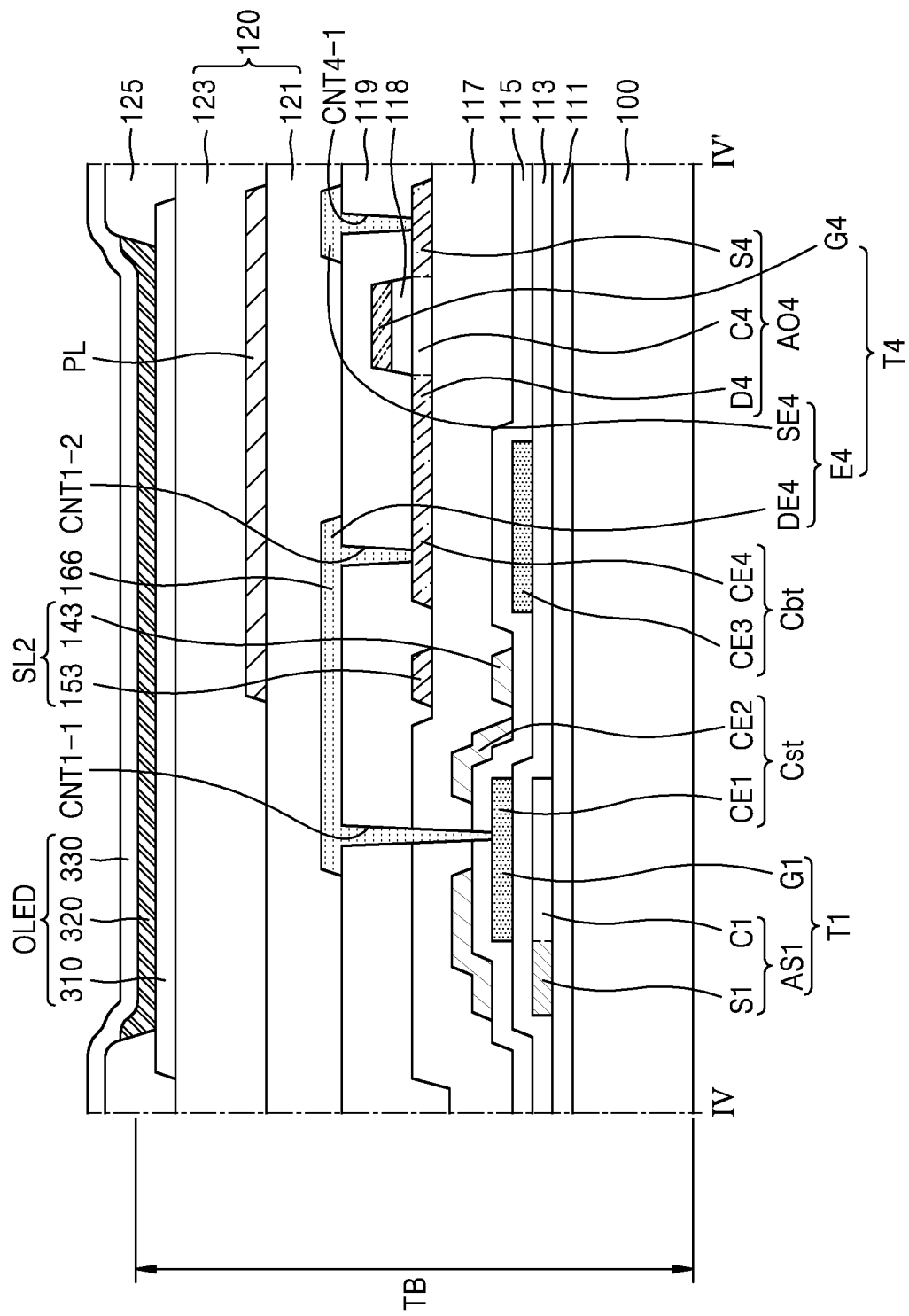
FIG. 12 is a schematic cross-sectional view of the pixel circuit taken along line IV-IV' of FIG. 9.

FIG. 9 is a plan view of one pixel circuit of a display panel according to an embodiment, and FIGS. 10A to 10D are plan views of some layers of FIG. 9. FIGS. 11A and 11B are schematic cross-sectional views of the pixel circuit taken along line III-III' of FIG. 9, and FIG. 12 is a cross-sectional view of the pixel circuit taken along line IV-IV' of FIG. 9.

Figure 10A:
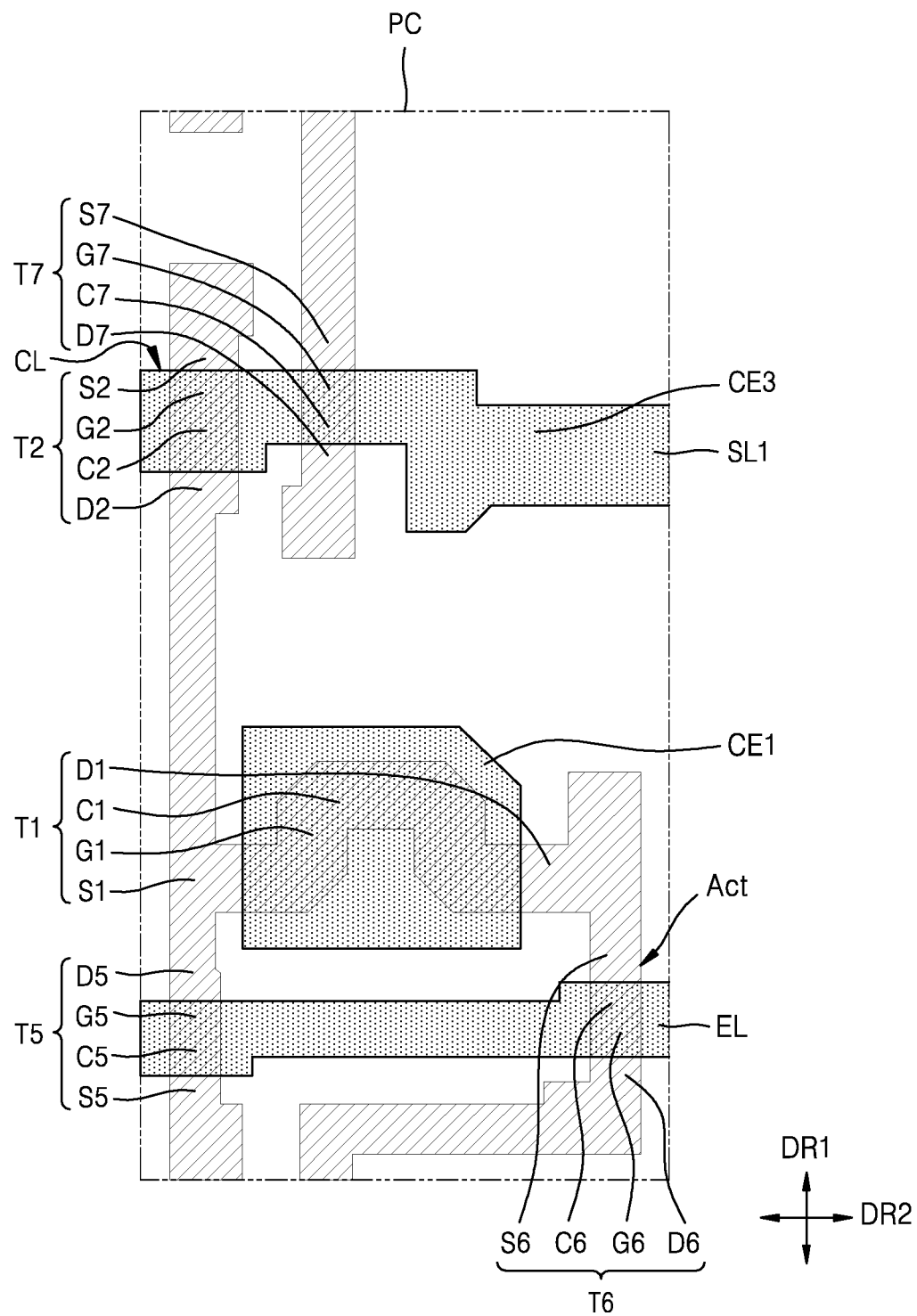
FIGS. 10A to 10D are plan views of some layers of FIG. 9.
Figure 10B:
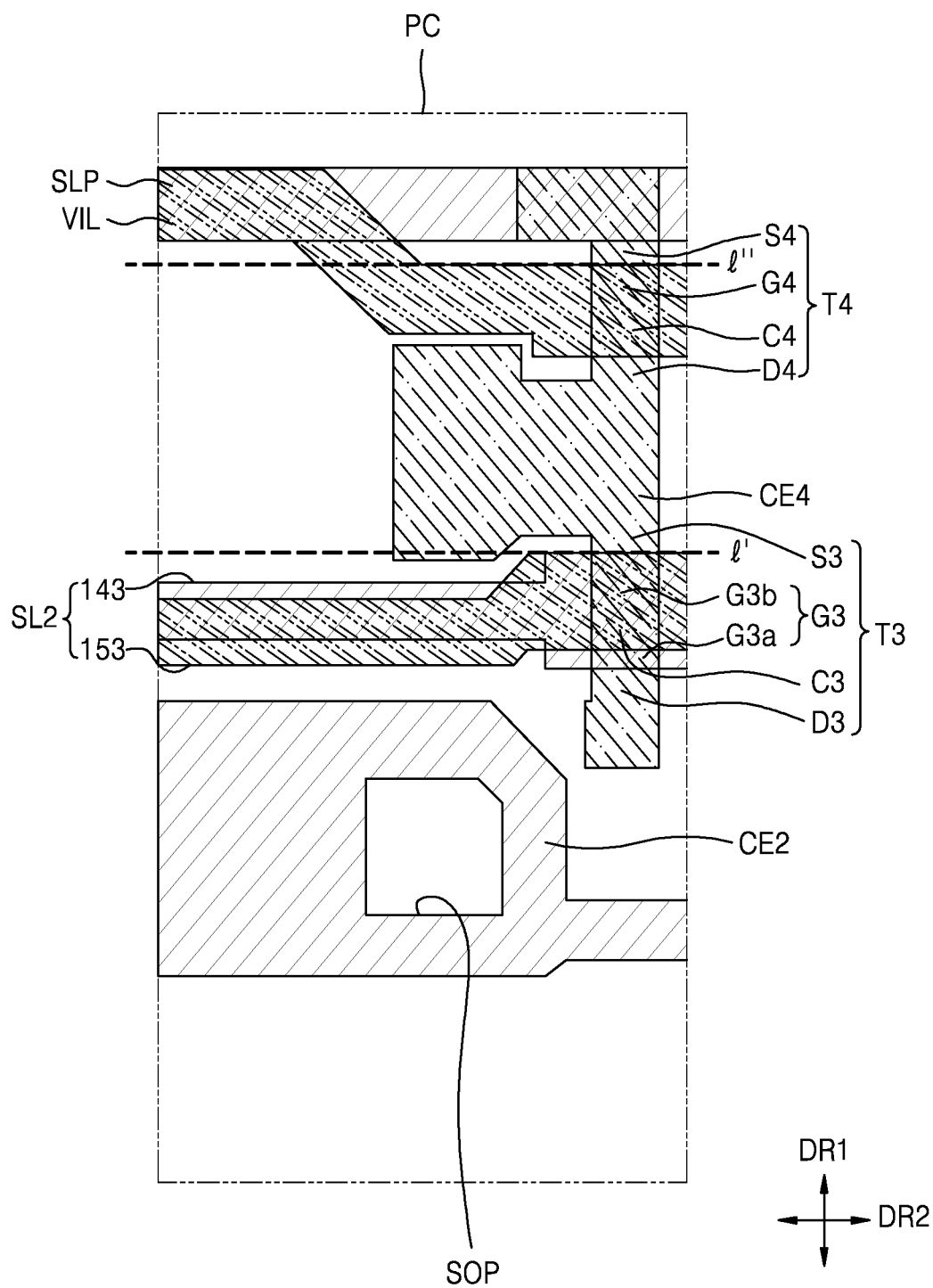
Figure 10C:
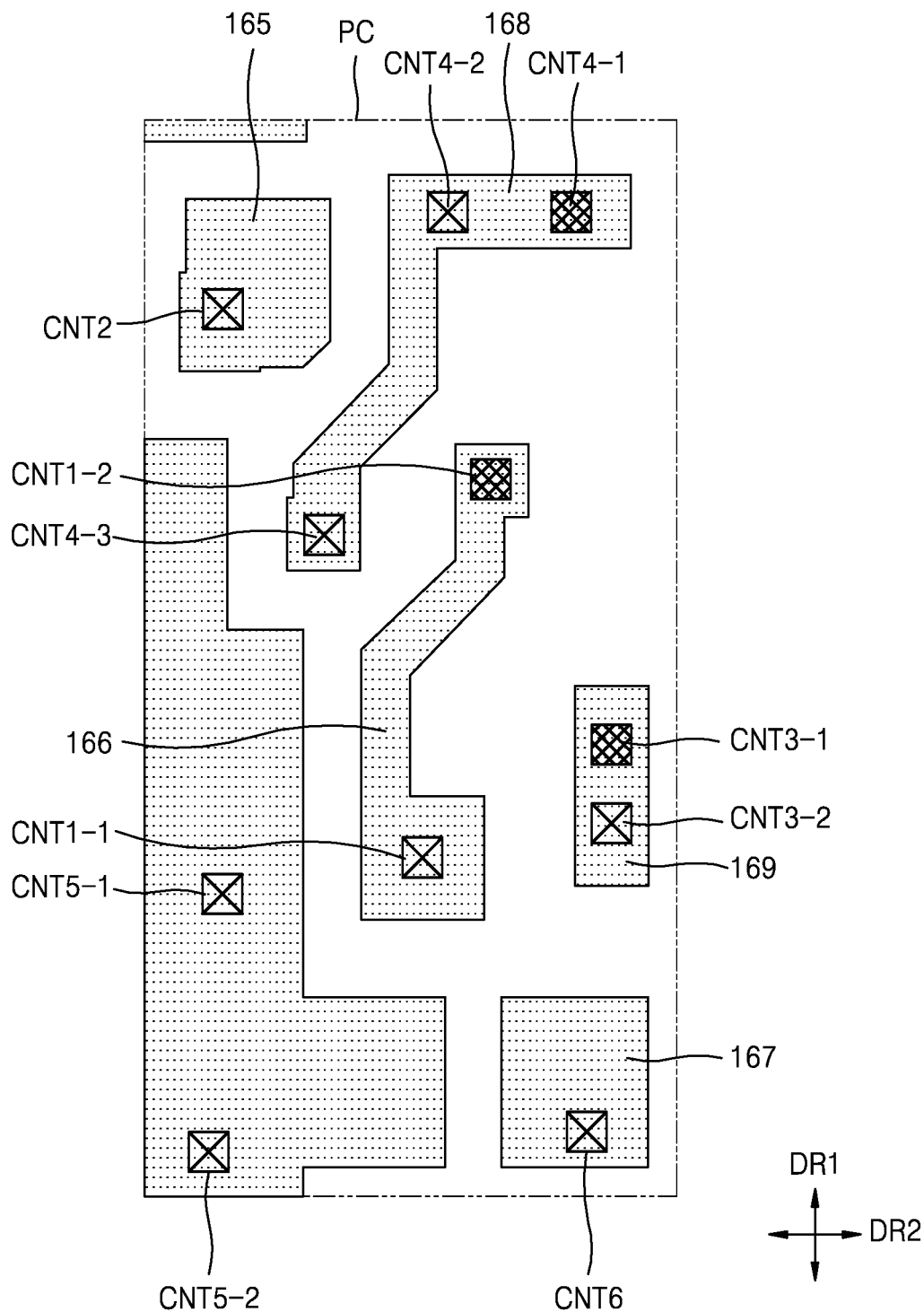
Figure 10D:
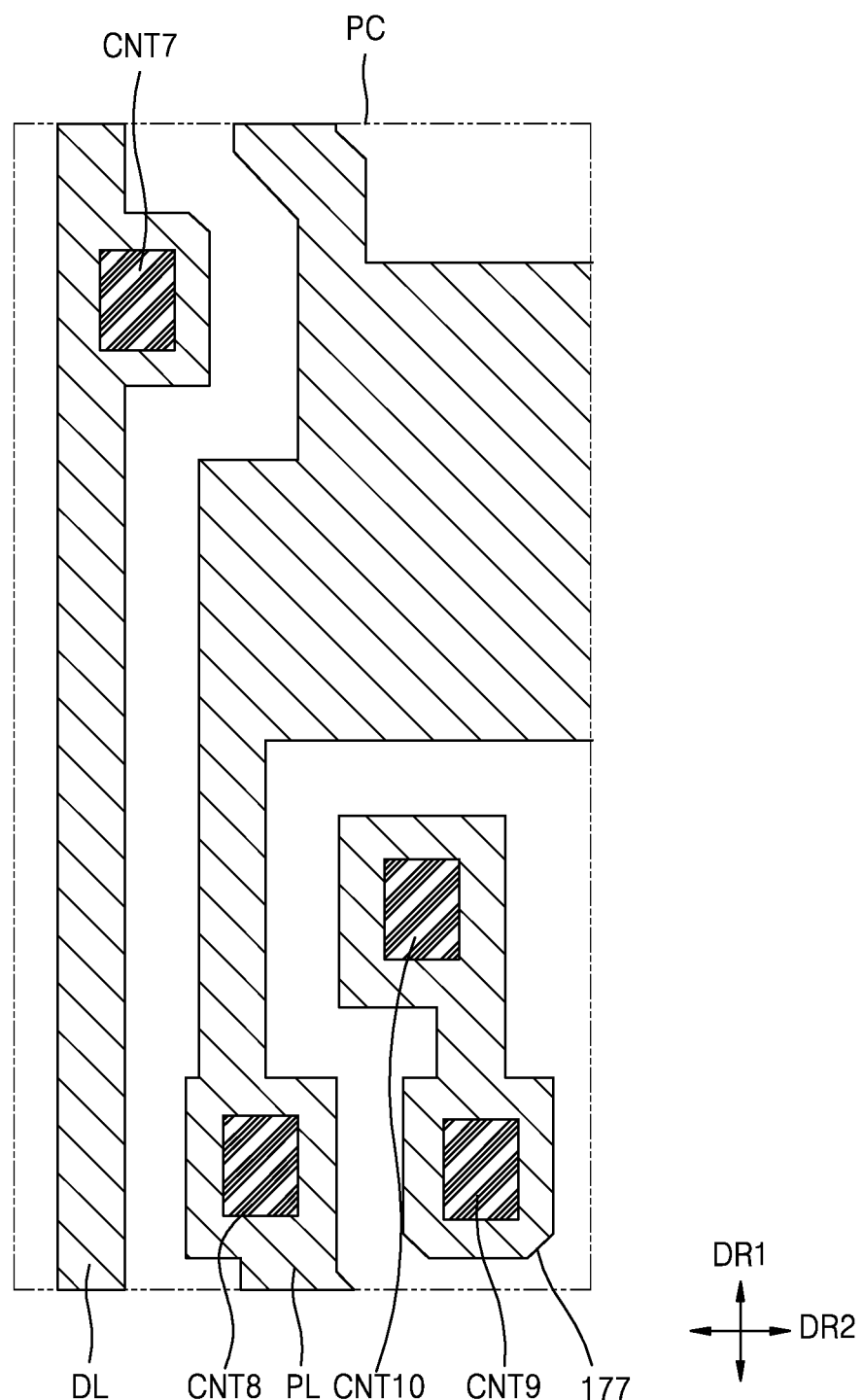

FIGS. 10A to 10D are plan views of some layers of FIG. 9, wherein FIG. 10A illustrates a semiconductor layer Act and the conductive layer CL on the substrate 100 and the buffer layer 111, and FIG. 10B illustrates the compensation thin-film transistor T3, the first initialization thin-film transistor T4, and the like on the second gate insulating layer 115. By way of example, FIG. 10C shows contact holes CNT1-1, CNT1-2, CNT2, CNT3-1, CNT3-2, CNT4-1, CNT4-2, CNT4-3, CNT5-1, CNT5-2, and CNT6 respectively electrically connecting devices, the node connecting line 166 and electrode layers 165, 167, 168, and 169 on the second interlayer insulating layer 119, and FIG. 10D illustrates the data line DL and the driving voltage line PL on the first planarization layer 121, and contact holes CNT7, CNT8, CNT9, and CNT10 respectively electrically connecting devices. Hereinafter, it will be described in more detail with reference to FIG. 9.

Referring to FIGS. 9, 10A, 10B, 10C, and 10D, the pixel circuit PC of the display apparatus according to an embodiment may include the data line DL and the driving voltage line PL extending in the first direction DR1, and the first scan line SL1, the second scan line SL2, the previous scan line SLp, the next scan line SLn (see FIG. 7), the emission control line EL, and the initialization voltage line VIL extending in the second direction DR2.

The pixel circuit PC may include the driving thin-film transistor T1, the switching thin-film transistor T2, the compensation thin-film transistor T3, the first initialization thin-film transistor T4, the operation control thin-film transistor T5, the emission control thin-film transistor T6, the second initialization thin-film transistor T7, the storage capacitor Cst, and the boost capacitor Cbt.

In an embodiment, the driving thin-film transistor T1, the switching thin-film transistor T2, the operation control thin-film transistor T5, the emission control thin-film transistor T6, and the second initialization thin-film transistor T7 may be provided as a thin-film transistor including a silicon semiconductor.

Each of the compensation thin-film transistor T3 and the first initialization thin-film transistor T4 may be provided as a thin-film transistor including an oxide semiconductor.

Semiconductor layers of the driving thin-film transistor T1, the switching thin-film transistor T2, the operation control thin-film transistor T5, the emission control thin-film transistor T6, and the second initialization thin-film transistor T7 may be on the same layer and may include the same or similar material. For example, the semiconductor layers may include polycrystalline silicon.

The semiconductor layers of the driving thin-film transistor T1, the switching thin-film transistor T2, the operation control thin-film transistor T5, the emission control thin-film transistor T6, and the second initialization thin-film transistor T7 may be disposed on the buffer layer 111 (see buffer layer 111 of FIG. 11A) on the substrate 100.

The semiconductor layers of the driving thin-film transistor T1, the switching thin-film transistor T2, the operation control thin-film transistor T5, the emission control thin-film transistor T6, and the second initialization thin-film transistor T7 may be electrically connected to each other and may be bent in various shapes.

Each of the semiconductor layers of the driving thin-film transistor T1, the switching thin-film transistor T2, the operation control thin-film transistor T5, the emission control thin-film transistor T6, and the second initialization thin-film transistor T7 may include a channel area and a source area and a drain area on both sides of the channel area. For example, the source area and the drain area may be doped with impurities, and the impurities may include N-type impurities or P-type impurities. The source area and the drain area may correspond to a source electrode and a drain electrode, respectively. Hereinafter, the terms source area and drain area may be used instead of the source electrode and the drain electrode.

The driving thin-film transistor T1 may include the driving semiconductor layer and the driving gate electrode G1. The driving semiconductor layer may include the driving channel area C1 and the driving source area S1 and the driving drain area D1 on both sides of the driving channel area C1. The driving semiconductor layer may have a substantially curved shape, and the driving channel area C1 may be formed longer than the other channel areas C2 to C7. For example, since the driving semiconductor layer may have a shape bent a plurality of times such as an omega (or arch) shape or the letter "S" to form a long channel length in a narrow space. Since the driving channel area C1 may be formed longer, a driving range of a gate voltage applied to the driving gate electrode G1 may be widened, so that the gradation of light emitted from the organic light-emitting diode OLED may be more precisely controlled and display quality may be improved. The driving gate electrode G1 may be an isolated or island type and may be provided to overlap the driving channel area C1 and the first gate insulating layer 113 (see FIG. 11A) with the driving channel area C1 and the first gate insulating layer 113 therebetween.

The storage capacitor Cst may overlap the driving thin-film transistor T1. The storage capacitor Cst may include the first electrode CE1 and a second electrode CE2. The driving gate electrode G1 may perform not only a function of a gate electrode of the driving thin-film transistor T1 but also a function of the first electrode CE1 of the storage capacitor Cst. For example, it may be understood that the driving gate electrode G1 and the first electrode CE1 may be integral.

The second electrode CE2 of the storage capacitor Cst may be provided to overlap the first electrode CE1 and the second gate insulating layer 115 (see FIG. 12) with the first electrode CE1 and the second gate insulating layer 115 therebetween. Here, the second gate insulating layer 115 may serve as a dielectric layer of the storage capacitor Cst.

The second electrode CE2 may have a storage opening SOP. The storage opening SOP may be formed by removing a portion of the second electrode CE2 and may have a closed shape. The node connecting line 166 may be electrically connected to the first electrode CE1 through the first connection contact hole CNT1-1 in the storage opening SOP. The second electrode CE2 may be electrically connected to the driving voltage line PL through the first driving contact hole CNT5-1 and an eighth contact hole CNT8. The second electrode CE2 may extend in the second direction DR2 to transmit the first power supply voltage ELVDD in the second direction DR2. Accordingly, in the display area DA, the driving voltage lines PL and second electrodes CE2 may form a mesh structure.

The switching thin-film transistor T2 may include a switching semiconductor layer and the switching gate electrode G2. The switching semiconductor layer may include a switching channel area C2, and the switching source area S2 and the switching drain area D2 on both sides of the switching channel area C2. The switching source area S2 may be electrically connected to the data line DL through the second contact hole CNT2, the seventh contact hole CNT7, and the first electrode layer 165, and the switching drain area D2 may be electrically connected to the driving source area S1.

The operation control thin-film transistor T5 may include an operation control semiconductor layer and the operation control gate electrode G5. The operation control semiconductor layer may include an operation control channel area C5, and the operation control source area S5 and the operation control drain area D5 on both sides of the operation control channel area C5. The operation control source area S5 may be electrically connected to the driving voltage line PL through the second driving contact hole CNT5-2 and the eighth contact hole CNT8, and the operation control drain area D5 may be electrically connected to the driving source area S1. The operation control gate electrode G5 may be provided as a portion of the emission control line EL.

The emission control thin-film transistor T6 may include an emission control semiconductor layer and the emission control gate electrode G6. The emission control semiconductor layer may include an emission control channel area C6, and the emission control source area S6 and the emission control drain area D6 on both sides of the emission control channel area C6. The emission control source area S6 may be electrically connected to the driving drain area D1, and the emission control drain area D6 may be electrically connected to the second electrode layer 167 through the sixth contact hole CNT6. The second electrode layer 167 may be electrically connected to the pixel electrode 310 (see pixel electrode 310 of FIG. 11A) of the organic light-emitting diode OLED through an upper electrode layer 177, the ninth contact hole CNT9, and the tenth contact hole CNT10 arranged or disposed on another layer. The emission control gate electrode G6 may be provided as a portion of the emission control line EL.

The second initialization thin-film transistor T7 may include a second initialization semiconductor layer and the second initialization gate electrode G7. The second initialization semiconductor layer may include the first initialization channel area C7, the second initialization source area S7 and the second initialization drain area D7 on both sides of the second initialization channel area C7. The second initialization source area S7 may be electrically connected to the initialization voltage line VIL through the fifth connection contact hole CNT4-3 and the third electrode layer 168, and the second initialization drain area D7 may be electrically connected to the first initialization source area S4, which will be described later below. The second initialization gate electrode G7 may be provided as a portion of the scan line SLn.

The first interlayer insulating layer 117 (see FIG. 11A) may be disposed on the thin-film transistors T1, T2, T5, T6, and T7 including the silicon semiconductor, and the thin-film transistors T3 and T4 including an oxide semiconductor may be disposed on the first interlayer insulating layer 117.

Semiconductor layers AO3 and AO4 of the compensation thin-film transistor T3 and the first initialization thin-film transistor T4 may be disposed on the same layer and may include the same or similar material. For example, the semiconductor layer may include an oxide semiconductor.

The compensation thin-film transistor T3 may include the compensation semiconductor layer AO3 (see FIG. 11A) including an oxide semiconductor and the compensation gate electrode G3. The compensation semiconductor layer AO3 may include a compensation channel area C3, and the compensation source area S3 and the compensation drain area D3 arranged or disposed on a side and another side of the compensation channel area C3, respectively. The compensation source area S3 may be bridged to the driving gate electrode G1 through the node connecting line 166. An end of the node connecting line 166 may be electrically connected to the compensation source area S3 through the second connection contact hole CNT1-2, and another end of the node connecting line 166 may be electrically connected to the driving gate electrode G1 through the first connection contact hole CNT1-1. The compensation source area S3 may be electrically connected to the first initialization drain area D4 on the same layer. The compensation drain area D3 may be electrically connected to a driving semiconductor layer of the driving thin-film transistor T1 and an emission control semiconductor layer of the light emitting control thin-film transistor T6 through the fourth electrode layer 169. The compensation gate electrode G3 may be provided as a portion of the second scan line SL2.

The first initialization thin-film transistor T4 may include the first initialization semiconductor layer AO4 (see FIG. 11A) including an oxide semiconductor and the first initialization gate electrode G4. The first initialization semiconductor layer AO4 may include a first initialization channel area C4, and the first initialization source area S4 and the first initialization drain area D4 on both sides of the first initialization channel area C4. The first initialization source area S4 may be electrically connected to the third electrode layer 168 through the third connection contact hole CNT4-1, and the third electrode layer 168 may be electrically connected to the initialization voltage line VIL through the fourth connection contact hole CNT4-2. The first initialization drain area D4 may be bridged to the driving gate electrode G1 through the node connecting line 166. The first initialization gate electrode G4 may be provided as a portion of the previous scan line SLp.

Referring to FIG. 10B, in an embodiment, the compensation semiconductor layer AO3 and the first initialization semiconductor layer AO4 may be integral with each other and may have an isolated or island shape.

The third gate insulating layer 118 (see FIG. 11A) may be disposed between the compensation semiconductor layer AO3 and the compensation gate electrode G3 and may be disposed between the first initialization semiconductor layer AO4 and the first initialization gate electrode G4 to correspond to each of the channel areas C3 and C4.

The third electrode CE3, which may be one electrode of the boost capacitor Cbt, may be provided as a portion of the first scan line SL1 and may be electrically connected to the switching gate electrode G2. The fourth electrode CE4 of the boost capacitor Cbt may be arranged or disposed to overlap the third electrode CE3 and may include an oxide semiconductor. The fourth electrode CE4 may be provided on the same layer as the compensation semiconductor layer AO3 of the compensation thin-film transistor T3 and the semiconductor layer AO4 of the first initialization thin-film transistor T4, and thus may be provided or disposed as an area between the compensation semiconductor layer AO3 and the initialization semiconductor layer AO4. Alternatively, the fourth electrode CE4 may extend from the first initialization semiconductor layer AO4. Alternatively, the fourth electrode CE4 may extend from the compensation semiconductor layer AO3.

The second interlayer insulating layer 119 (see FIG. 11A) may be disposed on the thin-film transistors T3 and T4 including the oxide semiconductor, and the driving voltage line PL, the node connecting line 166, and the electrode layers 165, 167, 168, and 169 may be disposed on the second interlayer insulating layer 119.

The first planarization layer 121 (see FIG. 11A) may be arranged or disposed to cover or overlap the driving voltage line PL and the data line DL.

In an embodiment, the first scan line SL1, the next scan line SLn, and the emission control line EL may be provided or disposed on the same layer as that of the driving gate electrode G1 and may be formed of the same or similar material as that of the driving gate electrode G1.

In an embodiment, some wires may be provided as two conductive layers disposed on different layers. For example, the second scan line SL2 may include a lower scan line 143 and an upper scan line 153 on different layers. The lower scan line 143 may be provided or disposed on the same layer as that of the second electrode CE2 of the storage capacitor Cst and may be formed of the same or similar material as that of the second electrode CE2 of the storage capacitor Cst, and the upper scan line 153 may be disposed on the third gate insulating layer 118. The lower scan line 143 may be arranged or disposed to at least partially overlap the upper scan line 153. Since the lower scan line 143 and the upper scan line 153 may correspond to a portion of the compensation gate electrode G3 of the compensation thin-film transistor T3, the compensation thin-film transistor T3 may have a double gate structure having a lower gate electrode G3a and an upper gate electrode G3b (see FIG. 11B) above and below a semiconductor layer, respectively.

In an embodiment, the first initialization thin-film transistor T4 may include at least a portion of the semiconductor layer by having one gate electrode. In this case, the first initialization thin-film transistor T4 may have a single gate structure. In an embodiment, the previous scan line SLp may include lower and upper previous scan lines on different layers. The lower previous scan line may be provided or disposed on the same layer as that of the second electrode CE2 of the storage capacitor Cst and may be formed of the same or similar material as that of the second electrode CE2 of the storage capacitor Cst, and the upper previous scan line may be disposed on the third gate insulating layer 118. The lower previous scan line may be arranged or disposed to at least partially overlap the upper previous scan line. Since the lower and upper previous scan lines may correspond to a portion of the first initialization gate electrode G4 of the first initialization thin-film transistor T4, the first initialization thin-film transistor T4 may have a double gate structure having a lower gate electrode G4a and an upper gate electrode G4b (see FIG. 11B) above and below the semiconductor layer, respectively.

In an embodiment, the pixel circuit PC may be arranged or disposed to correspond to the pixels PX of the display area DA illustrated in FIGS. 1 and 2, and may have substantially the same shape.

In an embodiment, the pixel circuit PC included in the display apparatus 1 (see FIG. 1) may be arranged or disposed to have a symmetrical shape with the pixel circuit PC adjacent thereto.

Hereinafter, a structure of a display apparatus according to an embodiment will be described in detail according to a stacking order with reference to FIGS. 11A and 11B. In FIGS. 11A and 11B, the same reference numerals as those in FIGS. 4 and 7 denote the same elements. Furthermore, FIGS. 11A and 11B mainly illustrate a structure of the compensation thin-film transistor T3, the first initialization thin-film transistor T4, and the boost capacitor Cbt, and some members may be omitted for ease of description.

Referring to FIGS. 11A and 11B, the display apparatus 1 may include various insulating layers such as the buffer layer 111, the first gate insulating layer 113, the second gate insulating layer 115, the third gate insulating layer 118, the first interlayer insulating layer 117, the second interlayer insulating layer 119, the first planarization layer 121, and a second planarization layer 123.

The substrate 100 may include a glass material, a ceramic material, a metal material, or a material having flexible or bendable characteristics. The substrate 100 may have a single layer or a multilayer structure, and in the case of the multilayer structure, may include an inorganic layer. In an embodiment, the substrate 100 may have an organic/inorganic/organic structure.

The buffer layer 111 may increase the smoothness of an upper surface of the substrate 100, and may be formed of an oxide film such as silicon oxide ($SiO_x$), and/or a nitride film such as silicon nitride ($SiN_x$), or silicon oxynitride (SiON).

The first gate insulating layer 113 may be disposed on the buffer layer 111, and the third electrode CE3 of the boost capacitor Cbt may be disposed on the first gate insulating layer 113. The second gate insulating layer 115 may be arranged or disposed to cover or overlap the third electrode CE3 of the boost capacitor Cbt, and a lower gate electrode G3a of the compensation thin-film transistor T3 and the initialization voltage line VIL may be disposed on the second gate insulating layer 115. Referring to FIG. 11B, in an embodiment, a lower gate electrode G4a of the first initialization thin-film transistor T4 may be disposed on the second gate insulating layer 115.

The first interlayer insulating layer 117 may be arranged or disposed to cover or overlap the lower gate electrode G3a and the initialization voltage line VIL of the compensation thin-film transistor T3, and the compensation semiconductor layer AO3, the first initialization semiconductor layer AO4, and the fourth electrode CE4 of the boost capacitor Cbt may be disposed on the first interlayer insulating layer 117. In an embodiment, the fourth electrode CE4 of the boost capacitor Cbt may extend from one of the compensation semiconductor layer AO3 and the first initialization semiconductor layer AO4.

The compensation semiconductor layer AO3 may include the compensation channel area C3, the compensation source area S3, and the compensation drain area D3, and the first initialization semiconductor layer AO4 may include the first initialization channel area C4, the first initialization source area S4, and the first initialization drain area D4.

In an embodiment, a lower gate electrode G3a of the compensation thin-film transistor T3 overlaps the compensation semiconductor layer AO3, but may overlap the compensation channel area C3 and the compensation drain area D3. For example, the lower gate electrode G3a of the compensation thin-film transistor T3 may overlap the compensation semiconductor layer AO3 by avoiding or being separate from the compensation source area S3. The lower gate electrode G3a of the compensation thin-film transistor T3 may be disposed so as not to overlap the compensation source area S3.

An upper gate electrode G3b of the compensation thin-film transistor T3 and an upper gate electrode G4b of the first initialization thin-film transistor T4 may be disposed on the third gate insulating layer 118. The gate electrodes G3 and G4 may be a single layer or multiple layers of at least one of Al, Pt, Pd, Ag, Mg, Au, Ni, Nd, Ir, Cr, Li, Ca, Mo, Ti, W, and Cu. After doping impurities into the channel areas C3 and C4, for example the C3 and C4 of FIG. 11A, when the third gate insulating layer 118 is patterned by using the upper gate electrodes G3b and G4b as a mask, the third gate insulating layer 118 may also have substantially the same shape as that of the upper gate electrodes G3b and G4b.

In an embodiment, as the first gate insulating layer 113 and the second gate insulating layer 115 are stacked on the substrate 100, the third gate insulating layer 118 may be arranged or disposed to cover or overlap the semiconductor layers AO3 and AO4.

The gate insulating layers 113, 115, and 118 may include an inorganic material including oxide or nitride. For example, the gate insulating layers 113, 115, and 118 may include $SiO_2$, $SiN_x$, SiON, $Al_2O_3$, $TiO_2$, $Ta_2O_5$, $HfO_2$, or $ZnO_2$.

The thin-film transistors T3 and T4 may include the second interlayer insulating layer 119 covering or overlapping the upper gate electrodes G3b and G4b, the source areas S3 and S4, and the drain areas D3 and D4, and electrode layers E3 and E4 on the second interlayer insulating layer 119.

The electrode layers E3 and E4 may include a source electrode electrically connected to the source areas S3 and S4 and a drain electrode electrically connected to the drain areas D3 and D4. Referring to FIG. 10C, the compensation electrode layer E3 is a portion of the fourth electrode layer 169, and the first initialization electrode layer E4 is a portion of the third electrode layer 168.

The interlayer insulating layers 117 and 119 may include an inorganic material including oxide or nitride. For example, the interlayer insulating layers 117 and 119 may include $SiO_2$, $SiN_x$, SiON, $Al_2O_3$, $TiO_2$, $Ta_2O_5$, $HfO_2$, or $ZnO_2$.

The first planarization layer 121 may be disposed on the electrode layers E3 and E4, and the driving voltage line PL may be disposed on the first planarization layer 121. The second planarization layer 123 may be arranged or disposed to cover or overlap the driving voltage line PL. The planarization layer 120 may include a general polymer such as BCB, polyimide (PI), HMDSO, PMMA, and PS, a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof. The organic light-emitting diode OLED may be disposed on the second planarization layer 123. The organic light-emitting diode OLED may include the pixel electrode 310, an intermediate layer 320 including an organic light-emitting layer, and an opposite electrode 330.

Referring to FIG. 7, the edge of the pixel electrode 310 may be covered with or overlapped by the pixel-defining layer 125 on the planarization layer 121, and a central area of the pixel electrode 310 may be exposed through an opening of the pixel-defining layer 125. The pixel-defining layer 125 may include at least one organic insulating material from among polyimide, polyamide, acrylic resin, BCB, and phenolic resin, and may be formed by spin coating or the like, within the spirit and the scope of the disclosure.

Referring to FIGS. 9 and 11A, the compensation thin-film transistor T3 according to an embodiment may include the compensation semiconductor layer AO3 having the compensation channel area C3, the compensation source area S3, and the compensation drain area D3, and the compensation electrode layer E3 located or disposed on or above the lower gate electrode G3a of the compensation thin-film transistor T3, and the upper gate electrode G3b of the compensation thin-film transistor T3. The compensation electrode layer E3 may be electrically connected to at least one of the compensation source area S3 and the compensation drain area D3.

In an embodiment, the lower gate electrode G3a of the compensation thin-film transistor T3 may overlap the compensation semiconductor layer AO3, but may overlap the compensation channel area C3 and the compensation drain area D3. For example, the lower gate electrode G3a of the compensation thin-film transistor T3 may be disposed so as not to overlap the compensation source area S3 and may overlap the compensation semiconductor layer AO3 by avoiding or being separate from the compensation source area S3.

In this case, since a value close to ideal channel potential mentioned in FIG. 13 may be maintained and the lower gate electrode G3a of the compensation thin-film transistor T3 may overlap the compensation channel area C3 and the compensation drain area D3, the interference with a neighboring signal close to the compensation source area S3 may be reduced.

Since an area of the lower gate electrode G3a of the compensation thin-film transistor T3 may be reduced as much as the compensation source area S3 may be avoided, neighboring devices may be arranged or disposed closer thereto. For example, the area of the pixel circuit PC may be reduced and the resolution may be increased.

In an embodiment, devices arranged or disposed above a straight line I' extending in the second direction DR2 of FIG. 9 may be moved by about 1 μm below the first direction DR1. As a result, a length of the first direction DR1 per pixel circuit PC may be reduced by about 1 μm, so that more pixel circuits PC may be arranged or disposed in the thin-film transistor substrate TB, resulting in high resolution.

Referring to the straight line I' extending in the second direction DR2 of FIG. 9, an end of the upper gate electrode G3b of the driving thin-film transistor T3 adjacent to the compensation source area S3 may coincide with an end of the lower gate electrode G3a of the compensation thin-film transistor T3 in a plan view.

In an embodiment, the display apparatus 1 may include the conductive layer CL arranged or disposed in the second direction DR2. The first scan line SL1 may be included as a portion of the conductive layer CL. A gap W2a between the lower gate electrode G3a of the compensation thin-film transistor T3 and the first scan line SL1 in a plan view may be equal to a gap W2b between the upper gate electrode G3b of the compensation thin-film transistor T3 and the first scan line SL1.

Referring to FIG. 11B, the first initialization thin-film transistor T4 according to an embodiment includes the first initialization semiconductor layer AO4 having the first initialization channel area C4, the first initialization source area S4, and the first initialization drain area D4, and the first initialization electrode layer E4 located or disposed on or above the lower gate electrode G4a of the first initialization thin-film transistor T4, and the upper gate electrode G4b of the first initialization thin-film transistor T4. The first initialization electrode layer E4 may be electrically connected to at least one of the first initialization source area S4 and the first initialization drain area D4.

In an embodiment, the lower gate electrode G4a of the first initialization thin-film transistor T4 may overlap the first initialization semiconductor layer AO4, but may overlap the first initialization channel area C4 and the first initialization drain area D4. The first initialization semiconductor layer AO4 may include an oxide semiconductor material.

In this case, since a value close to ideal channel potential mentioned in FIG. 13 may be maintained and the lower gate electrode G4a of the first initialization thin-film transistor T4 may overlap the first initialization channel area C4 and first initialization drain area D4, the interference with a neighboring signal close to the first initialization source area S4 may be reduced.

Since an area of the lower gate electrode G4a of the first initialization thin-film transistor T4 may be reduced as much as the first initialization source area S4 may be avoided, neighboring devices may be arranged or disposed closer thereto. For example, the area of the pixel circuit PC may be reduced and the resolution may be increased.

In an embodiment, devices arranged or disposed above a straight line I" extending in the second direction DR2 of FIG. 9 may be moved by about 1 μm below the first direction DR1. As a result, the length of the first direction DR1 per pixel circuit PC may be reduced by about 1 μm, so that more pixel circuits PC may be arranged or disposed in the thin-film transistor substrate TB, resulting in high resolution.

Although not shown in FIG. 9, referring to the straight line I" extending in the second direction DR2 of FIG. 9 and FIG. 11B, an end of the upper gate electrode G4b of the first initialization thin-film transistor T4 adjacent to the first initialization source area S4 may coincide with an end of the lower gate electrode G4a of the first initialization thin-film transistor T4 in a plan view.

As described above, the compensation thin-film transistor T3 and the first initialization thin-film transistor T4 may have the lower gate electrodes G3a and G4a overlapping the semiconductor layers AO3 and AO4 by avoiding or being separate from the source areas S3 and S4, respectively. In this case, since areas of the lower gate electrodes G3a and G4a may be reduced as much as the source areas S3 and S4 are avoided, respectively, neighboring devices may be arranged or disposed closer than when only one thin-film transistor may have a lower gate electrode.

In an embodiment, each of the source areas S3 and S4 may be avoided or being separate from and the lower gate electrodes G3a and G4a may be reduced by about 1 μm, respectively. For example, the length of the first direction DR1 may be reduced by about 2 μm per pixel circuit PC, and higher resolution may be realized.

FIG. 12 is a schematic cross-sectional view of the display panel taken along line IV-IV' of FIG. 9. In FIG. 12, the same reference numerals in FIGS. 9, 11A, and 11B denote the same elements, and a duplicate description will be omitted.

Referring to FIG. 12, the driving thin-film transistor T1, the first initialization thin-film transistor T4, the storage capacitor Cst, the boost capacitor Cbt, and the like may be disposed on the substrate 100.

The driving thin-film transistor T1 may include a driving semiconductor layer AS1 including the driving source area S1 and the driving channel area C1, and the driving gate electrode G1. The first initialization thin-film transistor T4 may include the first initialization electrode layer E4 including a first initialization source electrode SE4 and a first initialization drain electrode DE4, the first initialization semiconductor layer AO4 including the first initialization source area S4, the first initialization drain area D4, and the first initialization channel area C4, and the first initialization gate electrode G4.

The storage capacitor Cst may include the first electrode CE1 and the second electrode CE2, and the boost capacitor Cbt may include the third electrode CE3 and the fourth electrode CE4. As shown in the drawings, in an embodiment, the first electrode CE1 of the storage capacitor Cst may overlap the driving gate electrode G1 of the driving thin-film transistor T1, and the fourth electrode CE4 of the boost capacitor Cbt may extend from the first initialization semiconductor layer AO4.

The lower scan line 143 may be disposed on the same layer as that of the second electrode CE2 of the storage capacitor Cst, and the second scan line SL2 including the upper scan line 153 may be disposed on the same layer as that of the fourth electrode CE4 of the boost capacitor Cbt.

The gate electrode G1 of the driving thin-film transistor T1 may be electrically connected to the drain area D4 of the first initialization thin-film transistor T4 by the first connection contact hole CNT1-1, the node connecting line 166, and the second connection contact hole CNT1-2.

FIG. 13 is a graph illustrating a change in channel potentials according to an embodiment.

Referring to FIG. 13, the semiconductor layer may include a source area, a channel area, and a drain area. An x-axis represents a position away from a point of the source area in the semiconductor layer, and a y-axis represents a channel potential, for example, energy according to the x-axis position. Through FIG. 13, the change in channel potentials when a lower gate electrode may be below the semiconductor layer and may overlap exactly the middle of the channel area of the semiconductor layer (Ref. 1), when the lower gate electrode moves about 1 μm toward the source area S (S direction), when the lower gate electrode moves about 1 μm toward the drain area (D direction), and when the lower gate electrode does not exist (Ref. 2) may be seen.

In an embodiment, the lower gate electrodes may overlap the semiconductor layer by avoiding or being separate from the source area. In this case, since the change in channel potential remains the same as when the lower gate electrode overlaps exactly the middle of the channel area of the semiconductor layer (Ref. 1) and the lower gate electrode overlaps the channel area and the drain area, the interference with a neighboring signal close to the source area may be reduced. As a width of the lower gate electrode may be reduced, neighboring devices may be located or disposed closer thereto, thereby increasing resolution.

Although only a thin-film transistor substrate and a display apparatus including the same has been described so far, the disclosure is not limited thereto. For example, a method of manufacturing a thin-film transistor substrate and a display apparatus including the same is also within the spirit and the scope of the disclosure.

According to embodiments of the disclosure as described above, a thin-film transistor substrate having improved resolution and a display apparatus including the same may be implemented. However, the scope of the disclosure is not limited to the effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A thin-film transistor substrate comprising:
   a first thin-film transistor disposed on a substrate, the first thin-film transistor comprising:
      a first semiconductor layer comprising a first channel area, a first source area, and a first drain area;
      a first lower gate electrode disposed between the substrate and the first semiconductor layer, the first lower gate electrode including an end adjacent to the first source area that coincides with an end of the first channel area in a plan view;
      a first upper gate electrode disposed on the first semiconductor layer and overlapping the first channel area; and
      a first electrode layer disposed on the first upper gate electrode and electrically connected to at least one of the first source area and the first drain area, wherein
      the first lower gate electrode overlaps the first channel area and the first drain area.

2. The thin-film transistor substrate of claim 1, wherein the first lower gate electrode overlaps the first semiconductor layer and does not overlap the first source area.

3. The thin-film transistor substrate of claim 1, wherein
   the first upper gate electrode includes an end adjacent to the first source area,
   and
   the end of the first upper gate electrode and the end of the lower gate electrode coincide with each other in the plan view.

4. The thin-film transistor substrate of claim 3, wherein a distance between the first lower gate electrode and a conductive layer disposed on the substrate is a same as a distance between the first upper gate electrode and the conductive layer in a plan view.

5. The thin-film transistor substrate of claim 4, wherein the conductive layer is a scan line.

6. The thin-film transistor substrate of claim 1, wherein the first semiconductor layer comprises a silicon semiconductor material or an oxide semiconductor material.

7. The thin-film transistor substrate of claim 1, further comprising:
   a second thin-film transistor disposed on the substrate, the second thin-film transistor comprising:
      a second semiconductor layer;
      a second gate electrode partially overlapping the second semiconductor layer; and
      a second electrode layer disposed on the second gate electrode and electrically connected to the second semiconductor layer, wherein
      the first semiconductor layer comprises an oxide semiconductor material, and
      the second semiconductor layer comprises a silicon semiconductor material.

8. The thin-film transistor substrate of claim 7, further comprising:
   a third thin-film transistor disposed on the substrate, the third thin-film transistor comprising:
      a third semiconductor layer comprising a third channel area, a third source area, and a third drain area;
      a third lower gate electrode disposed between the substrate and the third semiconductor layer;
      a third upper gate electrode disposed on the third semiconductor layer and overlapping the third channel area; and
      a third electrode layer disposed on the third upper gate electrode and electrically connected to at least one of the third source area and the third drain area, wherein
      the third lower gate electrode overlaps the third channel area and the third drain area, and
      the third semiconductor layer comprises an oxide semiconductor material.

9. The thin-film transistor substrate of claim 8, wherein the first semiconductor layer and the third semiconductor layer are integral with each other and have an isolated shape.

10. The thin-film transistor substrate of claim 8, wherein the third lower gate electrode overlaps the third semiconductor layer and does not overlap the third source area.

11. The thin-film transistor substrate of claim 8, wherein
    the third upper gate electrode includes an end adjacent to the third source area,
    the third lower gate electrode includes an end adjacent to the third source area, and
    the end of the third upper gate electrode and the end of the third lower gate electrode coincide with each other in a plan view.

12. The thin-film transistor substrate of claim 8, wherein
    the first thin-film transistor is a compensation thin-film transistor, and
    the third thin-film transistor is an initialization thin-film transistor.

13. The thin-film transistor substrate of claim 7, comprising:
    a boost capacitor comprising a lower electrode and an upper electrode, wherein
    the lower electrode and the second gate electrode are disposed on a same layer, and
    the upper electrode and the first semiconductor layer are disposed on a same layer.

14. The thin-film transistor substrate of claim 13, wherein the upper electrode extends from the first semiconductor layer.

15. A display apparatus comprising:
    a first thin-film transistor disposed on a substrate; and
    a display element electrically connected to the first thin-film transistor, wherein
    the first thin-film transistor comprising:
       a first semiconductor layer comprising a first channel area, a first source area, and a first drain area;
       a first lower gate electrode disposed between the substrate and the first semiconductor layer, the first lower gate electrode including an end adjacent to the first source area that coincides with an end of the first Channel area in a plan view;
       a first upper gate electrode disposed on the first semiconductor layer and overlapping the first channel area; and a first electrode layer disposed on the first upper gate electrode and electrically connected to at least one of the first source area and the first drain area, and the first lower gate electrode overlaps the first channel area and the first drain area.

16. The display apparatus of claim 15, wherein the first lower gate electrode overlaps the first semiconductor layer and does not overlap the first source area.

17. The display apparatus of claim 15, wherein the first upper gate electrode includes an end adjacent to the first source area, and the end of the first upper gate electrode and the end of the first lower gate electrode coincide with each other in a plan view.

18. The display apparatus of claim 15, wherein the first semiconductor layer comprises a silicon semiconductor material or an oxide semiconductor material.

19. The display apparatus of claim 15, further comprising:

a second thin-film transistor disposed on the substrate, the second thin-film transistor comprising:

a second semiconductor layer;

a second gate electrode partially overlapping the second semiconductor layer; and a second electrode layer disposed on the second gate electrode and electrically connected to the second semiconductor layer, wherein the first semiconductor layer comprises an oxide semiconductor material, and the second semiconductor layer comprises a silicon semiconductor material.

20. The display apparatus of claim 19, further comprising:

a third thin-film transistor disposed on the substrate, the third thin-film transistor comprising:

a third semiconductor layer comprising a third channel area, a third source area, and a third drain area;

a third lower gate electrode disposed between the substrate and the third semiconductor layer;

a third upper gate electrode disposed on the third semiconductor layer and overlapping the third channel area; and a third electrode layer disposed on the third upper gate electrode and electrically connected to at least one of the third source area and the third drain area, wherein the third lower gate electrode overlaps the third channel area and the third drain area, and the third semiconductor layer comprises an oxide semiconductor material.

21. The display apparatus of claim 20, wherein the third lower gate electrode overlaps the third semiconductor layer and does not overlap the third source area.

22. The display apparatus of claim 20, wherein the third upper gate electrode includes an end adjacent to the third source area, the third lower gate electrode includes an end adjacent to the third source area, and the end of the third upper gate electrode and the end of the third lower gate electrode coincide with each other in a plan view.

23. The display apparatus of claim 20, wherein the first semiconductor layer and the third semiconductor layer are integral with each other and have an isolated shape.

24. The display apparatus of claim 19, comprising:

a boost capacitor comprising a lower electrode and an upper electrode, wherein the lower electrode and the second gate electrode are disposed on a same layer, and the upper electrode and the first semiconductor layer are disposed on a same layer.

25. The display apparatus of claim 19, comprising:

a storage capacitor comprising:

the second gate electrode as a first electrode; and a second electrode disposed on the second gate electrode, wherein the first lower gate electrode and the second electrode are disposed on a same layer.

* * * * *